US012581805B2

(12) United States Patent
Sakuma et al.

(10) Patent No.: US 12,581,805 B2
(45) Date of Patent: Mar. 17, 2026

(54) DISPLAY DEVICE AND METHOD FOR MANUFACTURING DISPLAY DEVICE

(71) Applicant: SHARP KABUSHIKI KAISHA, Sakai City (JP)

(72) Inventors: Jun Sakuma, Sakai City (JP); Yasushi Asaoka, Sakai City (JP)

(73) Assignee: SHARP KABUSHIKI KAISHA, Sakai City (JP)

( * ) Notice: Subject to any disclaimer, the term of this patent is extended or adjusted under 35 U.S.C. 154(b) by 379 days.

(21) Appl. No.: 18/266,820

(22) PCT Filed: Dec. 22, 2020

(86) PCT No.: PCT/JP2020/047789
§ 371 (c)(1),
(2) Date: Jun. 13, 2023

(87) PCT Pub. No.: WO2022/137310
PCT Pub. Date: Jun. 30, 2022

(65) Prior Publication Data
US 2024/0057394 A1      Feb. 15, 2024

(51) Int. Cl.
H10K 59/122      (2023.01)
H10K 50/14      (2023.01)
(Continued)

(52) U.S. Cl.
CPC .......... H10K 59/122 (2023.02); H10K 50/14 (2023.02); H10K 59/1201 (2023.02); *H10K 59/80522* (2023.02)

(58) Field of Classification Search
CPC .................................................. H10K 59/122
See application file for complete search history.

(56) References Cited

U.S. PATENT DOCUMENTS

| | | | |
|---|---|---|---|
| 2010/0079067 A1 | 4/2010 | Abe et al. | |
| 2012/0187389 A1* | 7/2012 | Shoda .................. | H10K 59/173 |
| | | | 257/E51.026 |

(Continued)

FOREIGN PATENT DOCUMENTS

| | | | |
|---|---|---|---|
| JP | 2010103461 A | | 5/2010 |
| JP | 2011060518 A | * | 3/2011 |

(Continued)

*Primary Examiner* — Mariceli Santiago
(74) *Attorney, Agent, or Firm* — ScienBiziP, P.C.

(57)      ABSTRACT

A display device includes a first common charge transport layer, a first light-emitting layer and a second light-emitting layer each of which is formed on the first common charge transport layer, a common electrode formed over both of the first light-emitting layer and the second light-emitting layer, and a leakage blocking layer having an insulating property, the leakage blocking layer being superimposed on two adjacent end portions of the first light-emitting layer and the second light-emitting layer in plan view, and a distance between the first common charge transport layer and the common electrode is larger in a first region where each of the first light-emitting layer and the second light-emitting layer is superimposed on the leakage blocking layer than in a second region where each of the first light-emitting layer and the second light-emitting layer is not superimposed on the leakage blocking layer.

20 Claims, 21 Drawing Sheets

(51) Int. Cl.
    *H10K 59/12*        (2023.01)
    *H10K 59/80*        (2023.01)

(56) References Cited

U.S. PATENT DOCUMENTS

| | | | |
|---|---|---|---|
| 2016/0104760 A1 | 4/2016 | Maeda | |
| 2016/0380035 A1* | 12/2016 | Cho | H10K 50/17 |
| | | | 257/40 |
| 2017/0358770 A1 | 12/2017 | Maeda | |
| 2019/0103573 A1 | 4/2019 | Hamada et al. | |
| 2019/0326537 A1 | 10/2019 | Kobayashi et al. | |

FOREIGN PATENT DOCUMENTS

| | | | | |
|---|---|---|---|---|
| JP | 2016076453 A | 5/2016 | | |
| JP | 2019067747 A | 4/2019 | | |
| JP | 2019160632 A | 9/2019 | | |
| JP | 2019192337 A | 10/2019 | | |
| KR | 20200137847 A * | 12/2020 | | H10K 50/856 |
| WO | WO-2020213070 A1 * | 10/2020 | | H10K 59/80521 |

* cited by examiner

100

31

36
35
34(34R)
33
32(32R)
30

38

34(34R)

37

34(34R)

38

32
(32R)

DISPLAY DEVICE AND METHOD FOR MANUFACTURING DISPLAY DEVICE

TECHNICAL FIELD

The disclosure relates to a display device and a method for manufacturing the display device.

BACKGROUND ART

PTL 1 discloses an organic EL display panel (display device) including a pixel electrode, a partition partitioning the pixel electrode, a light-emitting medium layer formed on the pixel electrode, and a counter electrode (common electrode) formed on the light-emitting medium layer. Additionally, the light-emitting medium layer includes a hole transport layer and a light-emitting layer formed on the hole transport layer. The hole transport layer and the light-emitting layer are formed in stripes, and these two stripe-shaped layers are orthogonal to each other.

In this display device, the hole transport layer and the light-emitting layer are formed in stripes so as to be orthogonal to each other, which can form the light-emitting medium layer so as to be uniform.

CITATION LIST

Patent Literature

PTL 1: JP 2010-103461 A

SUMMARY

Technical Problem

In the display device according to PTL 1, the light-emitting layer is formed on the hole transport layer between adjacent partitions. On the other hand, the hole transport layer is layered not only between the adjacent partitions but also on each partition. Thus, in a region where the light-emitting layer is thinly formed, such as a corner portion formed by a side surface and an upper surface of the partition, or in a region where the light-emitting layer is not formed on the partition, a distance between the hole transport layer and the common electrode is shorter than that in a region where the light-emitting layer is formed. As described above, in the region where the distance between the hole transport layer and the common electrode is shorter, a leakage current is generated, which causes deterioration in display quality such as color mixing or display blurring or deterioration in display efficiency of the display device.

An object of the disclosure is to provide a display device capable of suppressing generation of a leakage current, and a method for manufacturing the display device.

Solution to Problem

In order to solve the problems described above, a display device according to an aspect of the disclosure includes a first common charge transport layer, a first light-emitting layer and a second light-emitting layer each of which is formed on the first common charge transport layer, a common electrode formed over both of the first light-emitting layer and the second light-emitting layer, and a leakage blocking layer having an insulating property, the leakage blocking layer being superimposed on two adjacent end portions of the first light-emitting layer and the second light-emitting layer in plan view, and a distance between the first common charge transport layer and the common electrode is larger in a first region in which each of the first light-emitting layer and the second light-emitting layer is superimposed on the leakage blocking layer than in a second region in which each of the first light-emitting layer and the second light-emitting layer is not superimposed on the leakage blocking layer.

Further, in order to solve the problems described above, a method for manufacturing a display device according to an aspect of the disclosure includes forming a first pixel electrode and a second pixel electrode, forming a first common charge transport layer on both of the first pixel electrode and the second pixel electrode, forming a first light-emitting layer and a second light-emitting layer at positions facing the first pixel electrode and the second pixel electrode on the first common charge transport layer, forming a leakage blocking layer having an insulating property, the leakage blocking layer being superimposed on two adjacent end portions of the first light-emitting layer and the second light-emitting layer in plan view, a portion of the leakage blocking layer superimposed on the end portion of the first light-emitting layer and a portion of the leakage blocking layer superimposed on the end portion of the second light-emitting layer being integrated, and forming a common electrode over both of the first light-emitting layer and the second light-emitting layer, and in the forming the leakage blocking layer, the leakage blocking layer is formed in a manner that a distance between the first common charge transport layer and the common electrode is larger in a first region in which each of the first light-emitting layer and the second light-emitting layer is superimposed on the leakage blocking layer than in a second region in which each of the first light-emitting layer and the second light-emitting layer is not superimposed on the leakage blocking layer.

Further, in order to solve the problems described above, a method for manufacturing a display device according to an aspect of the disclosure includes forming a first pixel electrode and a second pixel electrode, forming a first common charge transport layer on both of the first pixel electrode and the second pixel electrode, forming a leakage blocking layer having an insulating property on the first common charge transport layer, forming a first light-emitting layer and a second light-emitting layer on the first common charge transport layer and the leakage blocking layer, and forming a common electrode over both of the first light-emitting layer and the second light-emitting layer, and in the forming the leakage blocking layer, the leakage blocking layer is superimposed on two adjacent end portions of the first light-emitting layer and the second light-emitting layer in plan view, a portion of the leakage blocking layer superimposed on the end portion of the first light-emitting layer and a portion of the leakage blocking layer superimposed on the end portion of the second light-emitting layer are integrated, and the leakage blocking layer is formed in a manner that a distance between the first common charge transport layer and the common electrode is larger in a first region in which each of the first light-emitting layer and the second light-emitting layer is superimposed on the leakage blocking layer than in a second region in which each of the first light-emitting layer and the second light-emitting layer is not superimposed on the leakage blocking layer.

DESCRIPTION OF EMBODIMENTS

Figure 1:
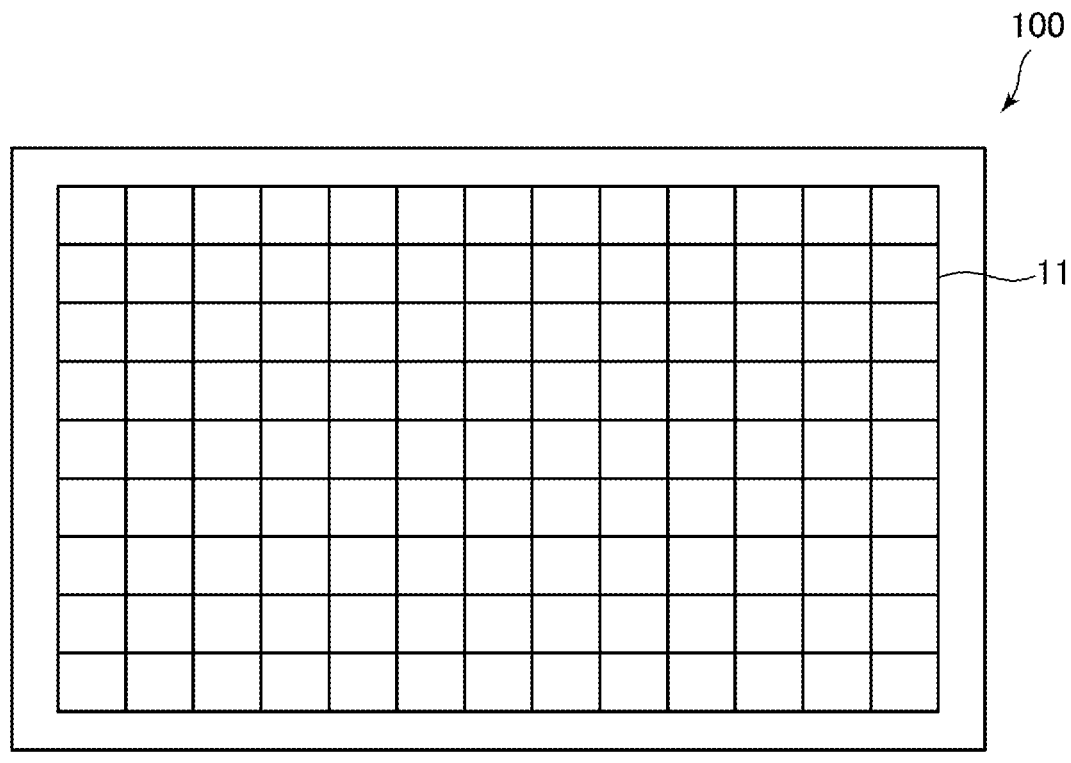
FIG. 1 is a plan view schematically illustrating a configuration in a display region of a display device according to a first embodiment of the disclosure.

With reference to the drawings, embodiments of the disclosure will be described below. Note that, in the drawings, identical or equivalent members are given an identical reference sign, and redundant descriptions thereof will be omitted.

Note that hereinafter, "the same layer" means that the layer is formed in the same process (film formation step), "a lower layer" means that the layer is formed in an earlier process than the process in which the layer to be compared is formed, and "an upper layer" means that the layer is formed in a later process than the process in which the layer to be compared is formed.

First Embodiment

Display Device

A configuration of a display device 100 according to a first embodiment of the disclosure will be described with reference to FIG. 1. FIG. 1 is a plan view schematically illustrating a configuration in a display region of the display device 100 according to the first embodiment of the disclosure. The display device 100 is a display device such as an organic EL display or a Quantum dot Light Emitting Diode (QLED) display. Hereinafter, a case in which the display device 100 is a QLED display will be described as an example.

As illustrated in FIG. 1, the display device 100 includes a plurality of pixels 11. The plurality of pixels 11 are arrayed in a matrix in the display device 100.

Figure 2:
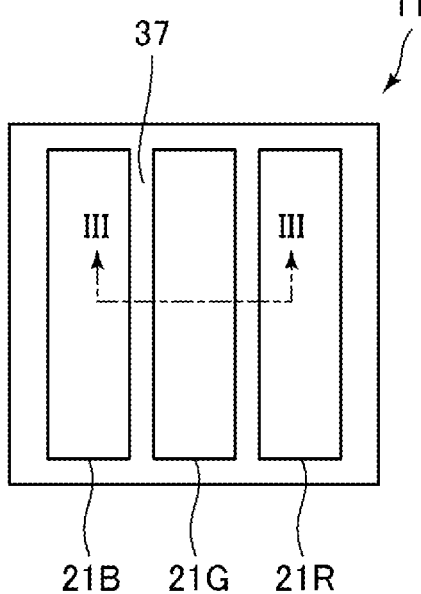
FIG. 2 is a plan view schematically illustrating a pixel included in the display device according to the first embodiment of the disclosure.

As illustrated in FIG. 2, each pixel 11 is constituted by a first subpixel 21B, a second subpixel 21G, and a third subpixel 21R. FIG. 2 is a plan view schematically illustrating a pixel 11 included in the display device 100 according to the first embodiment of the disclosure.

As illustrated in FIG. 2, in the display device 100, the first subpixel 21B, the second subpixel 21G, and the third subpixel 21R are arranged side by side in a left-right direction of the page. In the example illustrated in FIG. 2, the first subpixel 21B, the second subpixel 21G, and the third subpixel 21R are arranged in this order. Note that, when the first subpixel 21B, the second subpixel 21G, and the third subpixel 21R do not need to be particularly distinguished from each other, each of these subpixels is simply referred to as a subpixel 21.

The first subpixel 21B, the second subpixel 21G, and the third subpixel 21R emit blue light, green light, and red light, respectively. However, the colors of light to be emitted by the first subpixel 21B, the second subpixel 21G, and the third subpixel 21R are not limited to blue, green, and red, respectively. For example, each of the first subpixel 21B, the second subpixel 21G, and the third subpixel 21R may emit light with the same color.

Figure 3:
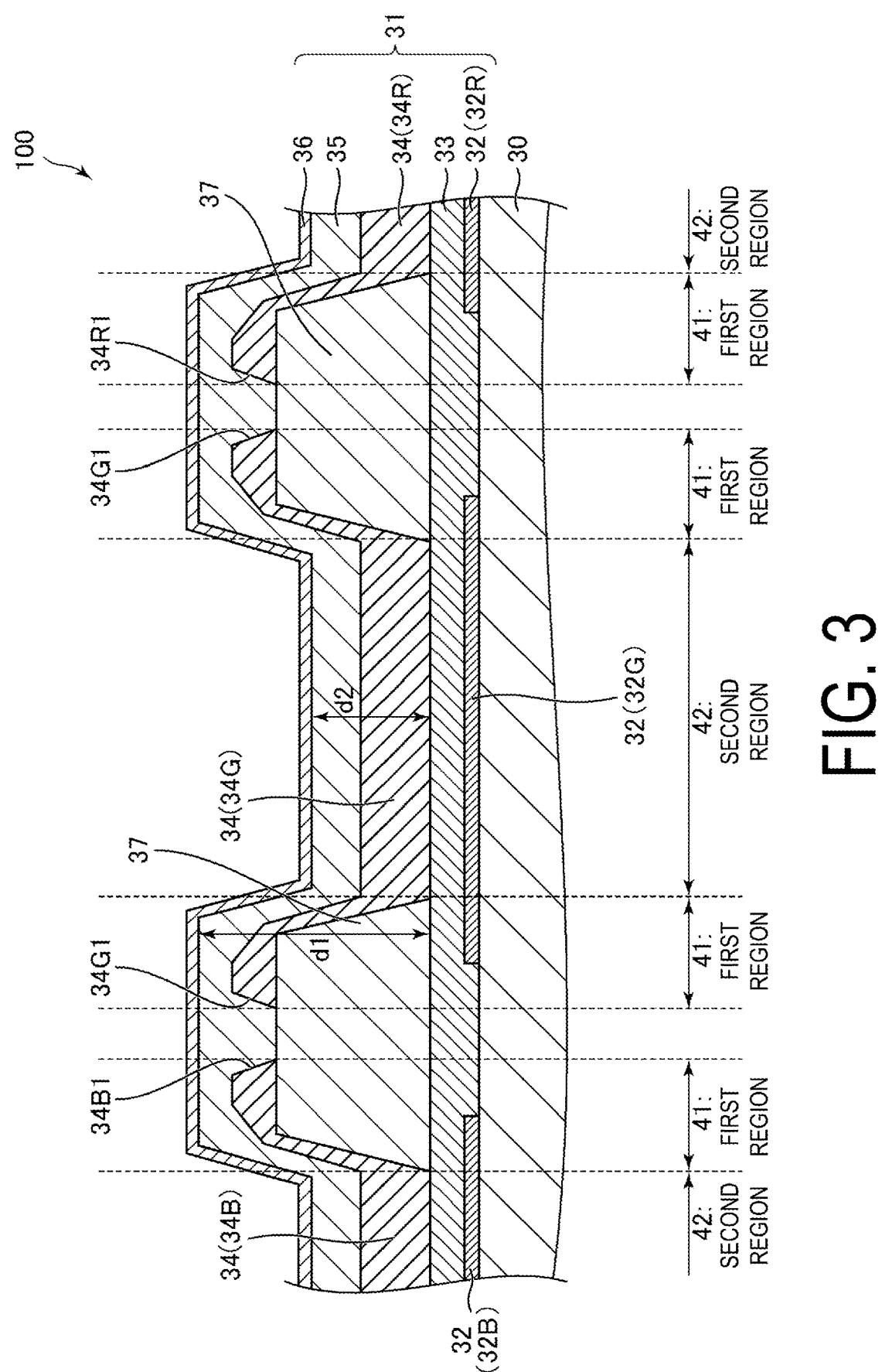
FIG. 3 is a cross-sectional view schematically illustrating a configuration in a display region of the display device according to the first embodiment of the disclosure.

FIG. 3 illustrates a cross-sectional structure of a display region in which the pixels 11 are arrayed in the display device 100. FIG. 3 is a cross-sectional view schematically illustrating a configuration in a display region of the display device 100 according to the first embodiment of the disclosure. FIG. 3 is a cross-sectional view of the pixel 11 illustrated in FIG. 2 taken along a line III-III.

That is, as illustrated in FIG. 3, the display device 1 includes a substrate 30, a light-emitting element layer 31, and a leakage blocking layer 37. The light-emitting element layer 31 includes a pixel electrode 32, a first common charge transport layer 33, a light-emitting layer 34, a second common charge transport layer 35, and a common electrode 36. Further, in the display device 1, the light-emitting element layer 31 and the leakage blocking layer 37 are disposed on the substrate 30.

Although not particularly illustrated, the substrate 30 is formed by layering a resin layer, a barrier layer, a Thin Film Transistor layer (TFT layer), and the like on a support substrate having a light-transmitting property, for example. In addition, the pixel electrode 32 is electrically connected to a thin film transistor of the TFT layer through a connection conductor provided inside a contact hole (not illustrated).

The pixel electrode 32 and the light-emitting layer 34 are provided for each subpixel 21. In the present specification, the pixel electrode 32 and the light-emitting layer 34 that correspond to the first subpixel 21B are referred to as a first pixel electrode 32B and a first light-emitting layer 34B, respectively. In addition, the pixel electrode 32 and the light-emitting layer 34 that correspond to the second subpixel 21G are referred to as a second pixel electrode 32G and a second light-emitting layer 34G. In addition, the pixel electrode 32 and the light-emitting layer 34 that correspond to the third subpixel 21R are referred to as a third pixel electrode 32R and a third light-emitting layer 34R. Note that the first pixel electrode 32B, the second pixel electrode 32G, and the third pixel electrode 32R are provided at positions facing the first light-emitting layer 34B, the second light-emitting layer 34G, and the third light-emitting layer 34R, respectively.

The first common charge transport layer 33, the second common charge transport layer 35, and the common electrode 36 are provided across a plurality of subpixels 21 (the first subpixel 21B, the second subpixel 21G, and the third subpixel 21R).

As illustrated in FIG. 3, a plurality of pixel electrodes 32 are provided on the substrate 30 for each subpixel, and the first common charge transport layer 33 is provided on the plurality of pixel electrodes 32. Furthermore, a plurality of light-emitting layers 34 are provided on the first common charge transport layer 33 so as to face the corresponding pixel electrodes 32 in plan view.

A peripheral edge of each light-emitting layer 34 is surrounded by the leakage blocking layer 37. The leakage blocking layer 37 is provided on the first common charge transport layer 33, and a cross-sectional shape of the leakage blocking layer 37 is a tapered shape tapered upward.

The light-emitting layer 34 is formed such that a non-light-emitting region including an end portion of the light-emitting layer 34 is superimposed on the leakage blocking layer 37. That is, the light-emitting layer 34 can be formed on the leakage blocking layer 37 and the first common charge transport layer 33. Note that the leakage blocking layer 37 will be described later in detail.

The second common charge transport layer 35 is provided on the plurality of light-emitting layers 34 and the leakage blocking layer 37, and the common electrode 36 is provided on the second common charge transport layer 35. That is, the leakage blocking layer 37 is provided between the first common charge transport layer 33 and the second common charge transport layer 35.

Note that in FIG. 3, the light-emitting element layer 31 has a configuration in which the pixel electrode 32, the first common charge transport layer 33, the light-emitting layer 34, the second common charge transport layer 35, and the common electrode 36 are layered, but is not limited thereto. For example, the light-emitting element layer 31 may have a configuration in which a first charge injection layer (not illustrated) is provided between the pixel electrode 32 and the first common charge transport layer 33, and a second charge injection layer (not illustrated) is provided between the second common charge transport layer 35 and the common electrode 36.

In addition, when charges can be appropriately injected from the common electrode 36 into the light-emitting layer 34, the light-emitting element layer 31 does not necessarily need to include the second common charge transport layer 35. In this case, the light-emitting element layer 31 can have a configuration in which the common electrode 36 is in contact with and covers the light-emitting layer 34.

In the display device 100 having the above-described configuration, when a potential difference is applied between the pixel electrode 32 and the common electrode 36, a first charge is injected from the pixel electrode 32 to the light-emitting layer 34 through the first common charge transport layer 33. In addition, a second charge is injected from the common electrode 36 into the light-emitting layer 34 through the second common charge transport layer 35. As a result, the first charge and the second charge are recombined in the light-emitting layer 34, and the light-emitting layer 34 emits light.

Note that when the display device 100 has an invert structure, the first charge is an electron. Further, the second charge is a hole. Further, the pixel electrode 32 is a cathode electrode. Further, the common electrode 36 is an anode electrode. Further, the first common charge transport layer 33 is an electron transport layer. Further, the second common charge transport layer 35 is a hole transport layer.

On the other hand, when the display device 100 has a conventional structure, the first charge is a hole. Furthermore, the second charge is an electron. Further, the pixel electrode 32 is an anode electrode. Further, the common electrode 36 is a cathode electrode. Further, the first common charge transport layer 33 is a hole transport layer. Further, the second common charge transport layer 35 is an electron transport layer.

Material of Each of Layers Constituting Light-Emitting Element Layer

The pixel electrode 32 and the common electrode 36 are made of a conductive material. Examples of the conductive material include at least one kind selected from the group consisting of metal and transparent conductive oxide. Examples of the metal include at least one kind selected from the group consisting of Al, Cu, Au, and Ag. Examples of the transparent conductive oxide include at least one kind selected from the group consisting of Indium Tin Oxide (ITO), Indium Zinc Oxide (IZO), Zinc Oxide (ZnO), Aluminum Zinc Oxide (AZO), and Boron Zinc Oxide (BZO). The first pixel electrode 32B, the second pixel electrode 32G, and the third pixel electrode 32R, and the common electrode 36 may be one layer made of one kind of conductive material, or may be a layered body of two or more layers made of two or more kinds of conductive materials different from each other. The two or more layers may include both a layer made of metal and a layer made of transparent conductive oxide.

When the first common charge transport layer 33 or the second common charge transport layer 35 is an electron transport layer, the electron transport layer is made of the following electron transport material. That is, examples of the electron transport material include at least one kind selected from the group consisting of zinc oxide, titanium oxide, and strontium titanium oxide. The zinc oxide is, for example, ZnO. The titanium oxide is, for example, $TiO_2$. The strontium titanium oxide is, for example, $SrTiO_3$. The electron transport material may be an electron transport material made of one kind of substance or an electron transport material made of a mixture of two or more kinds of substances.

On the other hand, when the first common charge transport layer 33 or the second common charge transport layer 35 is a hole transport layer, the hole transport layer is made of the following hole transport material. That is, examples of the hole transport material include at least one kind selected from the group consisting of a hole transport inorganic material and a hole transport organic material. Examples of the hole transport inorganic material include at least one kind selected from the group consisting of metal oxide, metal nitride, and metal carbide. Examples of the metal include at least one kind selected from the group consisting of Zn, Cr, Ni, Ti, Nb, Al, Si, Mg, Ta, Hf, Zr, Y, La, Sr, and Mo. Examples of the hole transport material include at least one kind selected from the group consisting of 4,4',4"-tris(9-carbazolyl)triphenylamine (TCTA), 4,4'-bis[N-(1-naphthyl)-N-phenyl-amino]-biphenyl (NPB), zinc phthalocyanine (ZnPC), di[4-(N,N-ditolylamino)phenyl]cyclohexane (TAPC), 4,4'-bis(carbazol-9-yl)biphenyl (CBP), 2,3,6,7,10,11-hexacyano-1,4,5,8,9,12-hexaazatriphenylene (HATCN), poly(N-vinylcarbazole) (PVK), poly(2,7-(9,9-di-n-octylfluorene)-(1,4-phenylene-((4-sec-butylphenyl)imino)-1,4-phenylene (TFB), a poly(triphenylamine) derivative (Poly-TPD), and poly(3,4-ethylenedioxythiophene)/poly(4-styrenesulfonic acid) (PEDOT-PSS). The hole transport material may be a hole transport material made of one kind of substance, or a hole transport material made of a mixture of two or more kinds of substances.

Further, the first common charge transport layer 33 preferably includes a water-insoluble material. More specifically, it is preferable that at least a surface of the first common charge transport layer 33 being in contact with the light-emitting layer 34 be made of a water-insoluble material. In the case where the surface of the first common charge transport layer 33 being in contact with the light-emitting layer 34 is made of the water-insoluble material, even when development with an aqueous solution is performed when the leakage blocking layer 37 is formed of photosensitive resin on the first common charge transport layer 33, the first common charge transport layer 33 can be prevented from being dissolved due to the development. In this way, since the first common charge transport layer 33 can be prevented from being dissolved due to the development in forming the leakage blocking layer 37, the leakage blocking layer 37 can be suitably formed on the first common charge transport layer 33 by using photolithography. Thus, the leakage blocking layer 37 with high resolution can be easily formed on the first charge transport layer 33 as compared with the case where the leakage blocking layer 37 is formed by using, for example, ink-jet or vapor deposition.

The light-emitting layer 34 includes a quantum dot as a light-emitting material. The quantum dot is, for example, a semiconductor fine particle having a particle size being equal to or less than 100 nm. Examples of the semiconductor fine particle include at least one kind selected from the group consisting of a group II-VI compound, a group III-V compound, and a group IV compound. Examples of the group II-VI compound include at least one kind selected from the group consisting of MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, and HgTe. Examples of the group III-V compound include at least one kind selected from the group consisting of GaAs, GaP, InN, InAs, InP, and InSb. Examples of the group IV compound include at least one kind selected from the group consisting of Si and Ge. The semiconductor fine particle may be a semiconductor fine particle made of the crystal, or a semiconductor fine particle having a core/shell structure, the semiconductor fine particle including a core made of the crystal and a shell that is made of a shell material having a wide band gap and that overcoats the core.

As described above, the light-emitting layer 34 is configured to include a quantum dot, but the light-emitting layer 34 may be configured to include an organic phosphor. However, the configuration in which the light-emitting layer 34 includes a quantum dot is preferable in that damage to the light-emitting layer 34 can be suppressed when the light-emitting layer 34 is formed by using an exposure process and a development process.

Leakage Blocking Layer

As illustrated in FIG. 3, the leakage blocking layer 37 defines an end portion of a light-emitting region in the light-emitting element layer 31, and functions as a so-called bank. Additionally, the leakage blocking layer 37 is made of a material having an insulating property. In particular, it is preferable that the leakage blocking layer 37 be made of photosensitive resin. As the photosensitive resin, for example, acrylic resin or polyimide resin can be used. When the leakage blocking layer 37 is made of photosensitive resin, the leakage blocking layer 37 can be easily formed into a desired shape by exposure and development. For this reason, the leakage blocking layer 38 with high resolution can be formed compared to the case where the leakage blocking layer 38 is formed by ink-jet, vapor deposition, or the like.

The leakage blocking layer 37 is arranged so as to be superimposed on two adjacent end portions 34B1 and 34G1 of a first light-emitting layer 34B and a second light-emitting layer 34G when the display device 100 is seen in plan view. Furthermore, the leakage blocking layer 37 is arranged so as to be superimposed on two adjacent end portions 34G1 and 34R1 of the second light-emitting layer 34G and the third light-emitting layer 34R.

Here, a region where each of the first light-emitting layer 34B and the second light-emitting layer 34G is superimposed on the leakage blocking layer 37, and a region where each of the second light-emitting layer 34G and the third light-emitting layer 34R is superimposed on the leakage blocking layer 37 are referred to as a first region 41. On the other hand, a region where each of the first light-emitting layer 34B, the second light-emitting layer 34G, and the third light-emitting layer 34R is not superimposed on the leakage blocking layer 37 in plan view is referred to as a second region 42. That is, the first region 41 corresponds to a non-light-emitting region of the light-emitting layer 34 in the light-emitting element layer 31, and the second region 42 corresponds to a light-emitting region of the light-emitting layer 34.

At this time, in the display device 100, a distance between the first common charge transport layer 33 and the common electrode 36 is larger in the first region 41 than in the second region 42 (d1>d2).

Now, when a light-emitting layer is formed in a section defined by a bank, an end portion of the light-emitting layer tends to be thinner than a central portion of the light-emitting layer. Thus, a leakage current is likely to be generated at the end portion of the light-emitting layer.

In the display device 100, the leakage blocking layer 37 having an insulating property and functioning as a bank is provided so as to be superimposed on both of the end portion 34B1 of the first light-emitting layer 34B and the end portion 34G1 of the second light-emitting layer 34G in plan view. In addition, the leakage blocking layer 37 is provided so as to be superimposed on both of the end portion 34G1 of the second light-emitting layer 34G and the end portion 34R1 of the third light-emitting layer in plan view. In addition, the distance between the first common charge transport layer 33 and the common electrode 36 is larger in the first region 41 than in the second region 42.

Thus, an electrical resistance between the first common charge transport layer 33 and the common electrode 36 in the first region 41 can be made equal to or higher than an electrical resistance between the first common charge transport layer 33 and the common electrode 36 in the second region 42. As a result, the display device 100 can suppress a leakage current generated at the end portion of the light-emitting layer 34.

Further, a light emission intensity at the end portion of the light-emitting layer 34 is smaller than that at the central portion of the light-emitting layer 34. This leads to non-uniformity in light emission intensity between the central portion of the light-emitting layer 34 and the end portion of the light-emitting layer 34. However, in the display device 100, light emission at the end portion of the light-emitting layer 34 can be suppressed by providing the leakage blocking layer 37. Thus, the display device 100 can suppress the non-uniformity in light emission intensity.

Further, in the display device 100 according to the first embodiment, the light-emitting layer 34 is arranged so as to be superimposed on the leakage blocking layer 37. That is, in the display device 100, the light-emitting layer 34 can be formed after the leakage blocking layer 37 is formed. For this reason, in the display device 100, damage to the light-emitting layer 34 can be suppressed in the manufacturing process. Thus, in the display device 100, the light-emitting layer 34 having high luminous efficiency and high reliability by suppressing deterioration can be formed.

Additionally, the leakage blocking layer 37 functions as a bank as described above. This can reduce the number of steps in the manufacturing process of the display device 100 as compared with a configuration in which the leakage blocking layer 37 and the bank are separately provided.

In addition, in the display device 100, a portion of the leakage blocking layer 37 superimposed on the end portion 34B1 of the first light-emitting layer, a portion of the leakage blocking layer 37 superimposed on the end portion 34G1 of the second light-emitting layer, and a portion of the leakage blocking layer 37 superimposed on the end portion 34R1 of the third light-emitting layer are integrally formed. That is, the leakage blocking layer 37 is integrally formed so as to partition the plurality of pixels 11 arranged in a matrix from each other and to partition each of the plurality of subpixels 21 constituting each pixel 11.

Since the leakage blocking layer 37 is integrally formed as described above, for example, compared to a configuration in which the leakage blocking layer 37 is formed for each subpixel 21, the formation of the leakage blocking layer 37 can be prevented from interfering with improving the resolution of the subpixel 21.

That is, in the configuration in which the leakage blocking layer 37 is formed for each subpixel 21, the minimum width of the leakage blocking layer 37 is smaller than the minimum width of the subpixel 21, and the formation of the leakage blocking layer 37 requires higher resolution than that of the formation of the subpixel 21. Due to this, the subpixel 21 cannot be formed beyond the resolution of the formation of the leakage blocking layer 37. On the other hand, in the case of the configuration in which the leakage blocking layer 37 is integrally formed as in the display device 100 according to the first embodiment, a resolution required for forming the leakage blocking layer 37 is about a resolution required for forming the subpixel. For this reason, the formation of the leakage blocking layer 37 can be prevented from interfering with improving the resolution of the subpixel 21.

In addition, since the leakage blocking layer 37 is integrally formed across the plurality of pixels 11, strength against peeling is higher than that in the case where the leakage blocking layer 37 is formed for each subpixel 21. This can suppress a defect rate generated in the manufacturing process of the display device 100.

In addition, the display device 100 may be a display device of a top-emitting type in which the pixel electrode 32 is a reflective electrode, the common electrode 36 is a transparent electrode, and light is extracted from a side (upper side in FIG. 3) opposite to the substrate 30. Alternatively, the display device 100 may be a display device of a bottom-emitting type in which the pixel electrode 32 is a transparent electrode, the common electrode 36 is a reflective electrode, and light is extracted from the substrate 30 side (lower side in FIG. 3).

However, in order to prevent a certain light-emitting layer 34 from emitting excessive light due to excessive excitation of the light-emitting layer 34 by light emitted from another adjacent light-emitting layer 34 or external light, it is preferable that the display device be a bottom-emitting type for a configuration in which the light-emitting layer 34 is provided over the leakage blocking layer 37 functioning as a bank. On the other hand, for a configuration in which the leakage blocking layer 37 functioning as the bank is provided over the light-emitting layer 34, a display device of a top-emitting type is preferably used.

The display device 100 according to the first embodiment has the configuration in which the light-emitting layer 34 is provided on the leakage blocking layer 37 functioning as the bank. Thus, the display device 100 is preferably a display device of a bottom-emitting type.

Method for Forming Light-Emitting Element Layer

Figure 4:
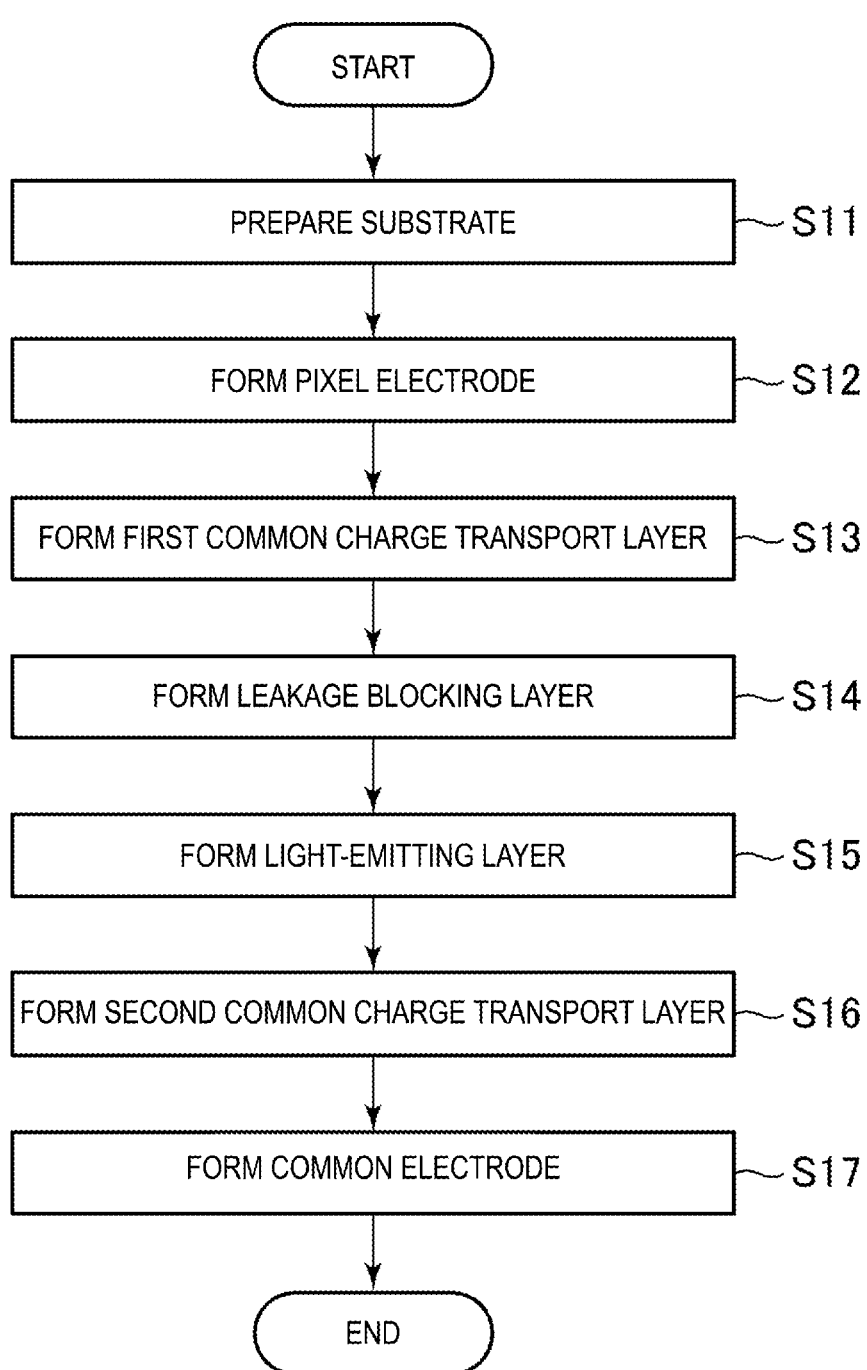
FIG. 4 is a flowchart illustrating a method for forming a light-emitting element layer included in the display device according to the first embodiment of the disclosure.
Figure 5A:
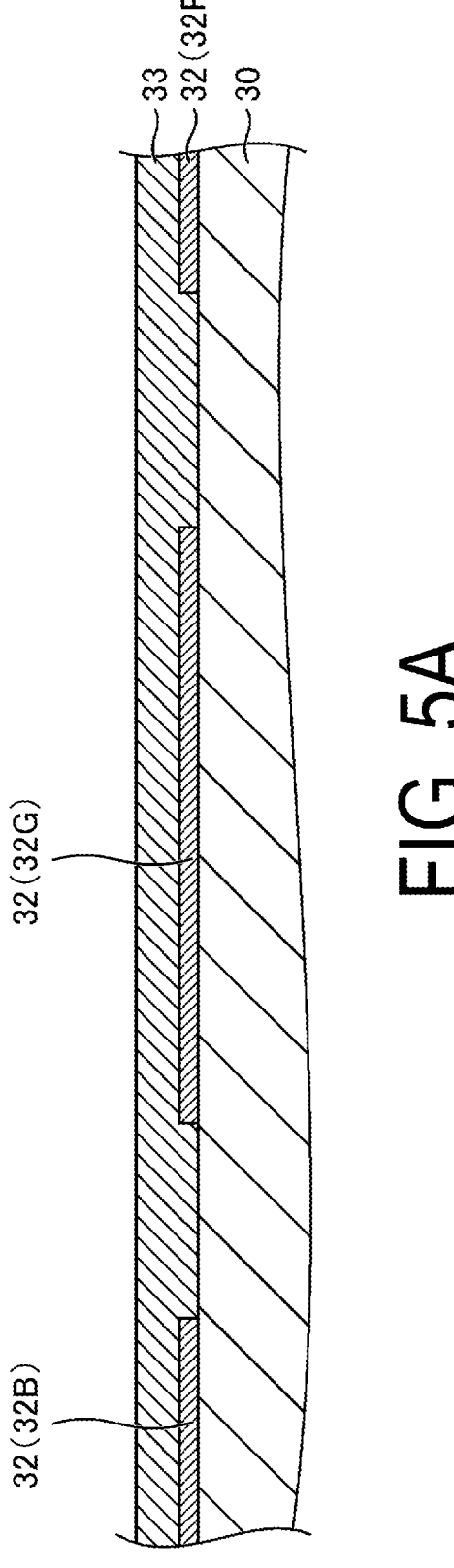
FIG. 5A is a cross-sectional view schematically illustrating an intermediate product of the display device according to the first embodiment of the disclosure.
Figure 5B:
FIG. 5B is a cross-sectional view schematically illustrating an intermediate product of the display device according to the first embodiment of the disclosure.
Figure 5C:
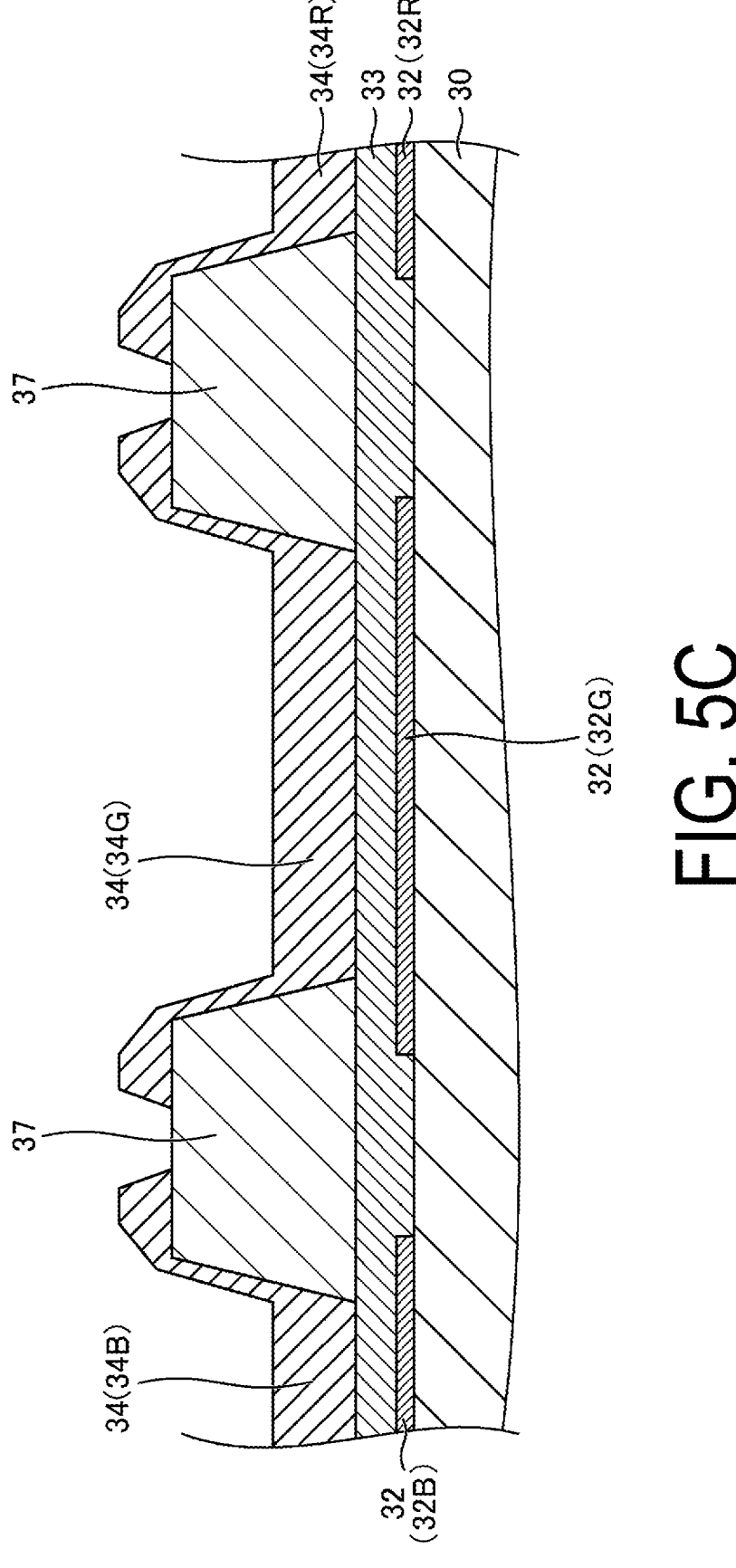
FIG. 5C is a cross-sectional view schematically illustrating an intermediate product of the display device according to the first embodiment of the disclosure.

FIG. 4 is a flowchart illustrating a method for forming the light-emitting element layer 31 included in the display device 100 according to the first embodiment of the disclosure. FIG. 5A to FIG. 5C are cross-sectional views schematically illustrating intermediate products of the display device 100 according to the first embodiment of the disclosure.

As illustrated in FIG. 4, first, the substrate 30 is prepared (step S11). Next, a plurality of pixel electrodes 32 (the first pixel electrode 32B, the second pixel electrode 32G, and the third pixel electrode 32R) illustrated in FIG. 5A are formed on the substrate 30 (step S12; pixel electrode forming). Then, as illustrated in FIG. 5A, the first common charge transport layer 33 is formed by vapor deposition or coating on the substrate 30 on which the plurality of pixel electrodes 32 are provided (step S13; first common charge transport layer forming).

As illustrated in FIG. 5B, on the first common charge transport layer 33 formed in step S13, the leakage blocking layer 37 having an insulating property is formed at a position where the leakage blocking layer 37 is superimposed over both of an end portion of the first pixel electrode 32B and an end portion of the second pixel electrode 32G that are adjacent to each other in plan view. In addition, the leakage blocking layer 37 is also formed at a position where the leakage blocking layer 37 is superimposed over both of an end portion of the second pixel electrode 32G and an end portion of the third pixel electrode 32R that are adjacent to each other in plan view (step S14; leakage blocking layer forming). The leakage blocking layer 37 can be formed by, for example, photolithography or vapor deposition.

The leakage blocking layer 37 has, for example, a grid shape so that the plurality of pixels 11 arranged in a matrix can be partitioned from each other and the plurality of subpixels 21 constituting each pixel 11 can be individually partitioned. Additionally, the leakage blocking layer 37 is arranged such that each of the partitioned regions faces the pixel electrode 32.

Next, the light-emitting layer 34 is formed on the first common charge transport layer 33 and the leakage blocking layer 37 by using, for example, photolithography, vapor deposition, or the like (step S15; light-emitting layer forming). To be more specific, as illustrated in FIG. 5C, the light-emitting layer 34 is formed so as to cover each region partitioned by the leakage blocking layer 37 on the first common charge transport layer 33 and a side surface of the leakage blocking layer 37.

After the light-emitting layer 34 is formed, the second common charge transport layer 35 is formed on the plurality of light-emitting layers 34 (the first light-emitting layer 34B and the second light-emitting layer 34G) and the leakage blocking layer 37 (step S16). Further, the common electrode 36 is formed on the second common charge transport layer 35 and over the plurality of light-emitting layers 34 (the first light-emitting layer 34B and the second light-emitting layer 34G) (step S17; common electrode forming).

In this manner, the light-emitting element layer 31 included in the display device 100 according to the first embodiment can be formed on the substrate 30.

First Modified Example of First Embodiment

Figure 6:
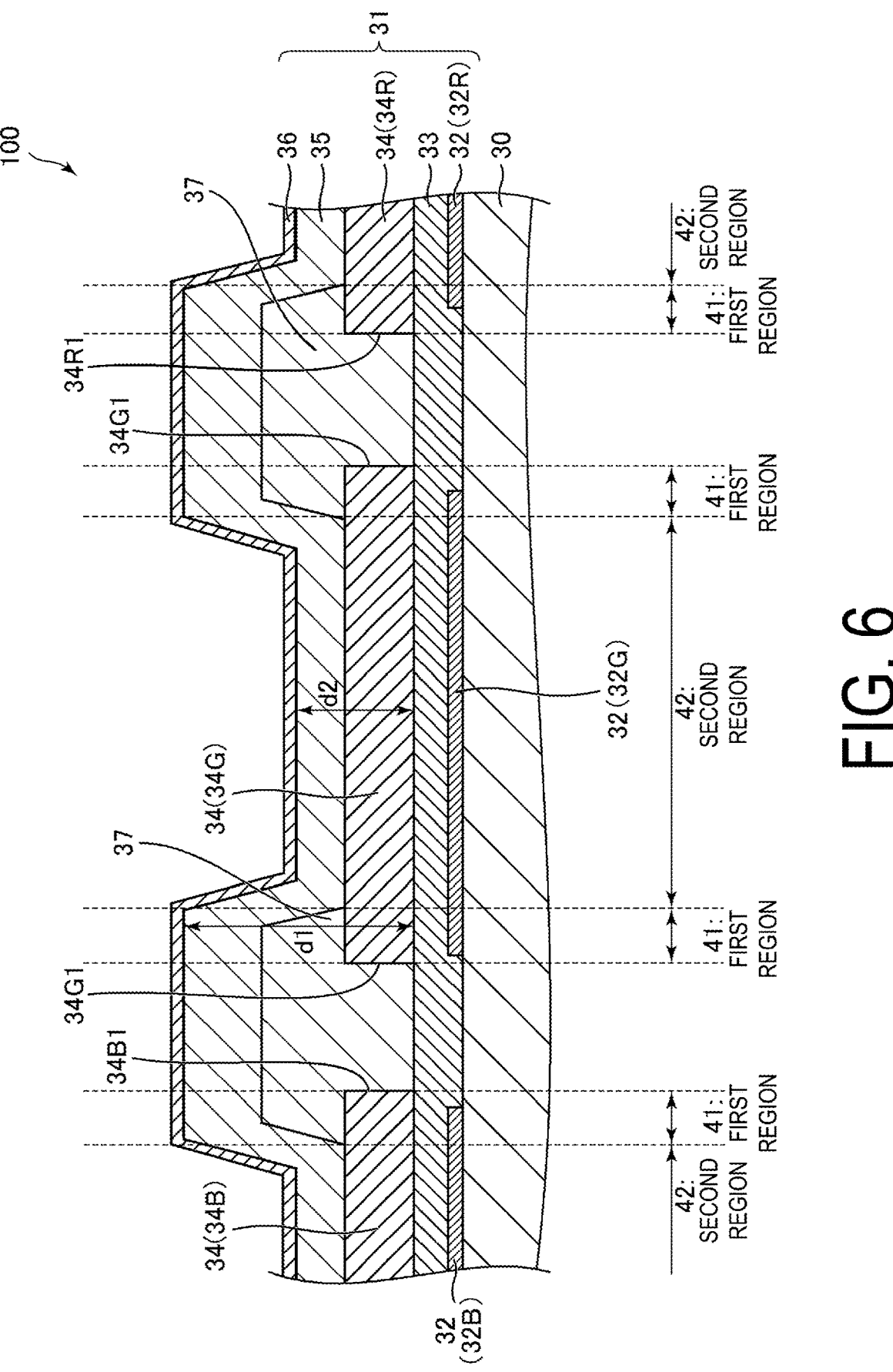
FIG. 6 is a cross-sectional view schematically illustrating a configuration in a display region of a display device according to a first modified example of the first embodiment of the disclosure.

Next, a configuration of a display device 100 according to a first modified example of the first embodiment will be described with reference to FIG. 6. FIG. 6 is a cross-sectional view schematically illustrating a configuration in a display region of the display device 100 according to the first modified example of the first embodiment of the disclosure.

As illustrated in FIG. 6, the display device 100 according to the first modified example of the first embodiment has a configuration in which a positional relationship between the light-emitting layer 34 and the leakage blocking layer 37 is changed in the configuration of the display device 100 according to the first embodiment.

That is, in the display device 100 according to the first embodiment, the light-emitting layer 34 is arranged so as to be superimposed on the leakage blocking layer 37. On the other hand, in the display device 100 according to the first modified example of the first embodiment, the leakage blocking layer 37 is provided on the first light-emitting layer 34B and the second light-emitting layer 34G at a position where the leakage blocking layer 37 is superimposed on the end portion 34B1 of the first light-emitting layer 34B and the end portion 34G1 of the second light-emitting layer 34G that are adjacent to each other in plan view. The leakage blocking layer 37 is also provided on the second light-emitting layer 34G and the third light-emitting layer 34R at a position where the leakage blocking layer 37 is superimposed on the end portion 34G1 of the second light-emitting layer 34G and the end portion 34R1 of the third light-emitting layer 34R that are adjacent to each other in plan view.

Moreover, the first light-emitting layer 34B, the second light-emitting layer 34G, and the third light-emitting layer 34R are formed on the same plane.

As described above, the display device 100 according to the first modified example of the first embodiment has a configuration similar to that of the display device 100 according to the first embodiment except that the positional relationship between the light-emitting layer 34 and the leakage blocking layer 37 is different.

For the display device 100 according to the first modified example of the first embodiment, the leakage blocking layer 37 is formed after the first light-emitting layer 34B, the second light-emitting layer 34G, and the third light-emitting layer 34R are formed on the first common charge transport layer 33. For this reason, for the display device 100 according to the first modified example of the first embodiment, the light-emitting layer 34 can be formed without being affected by unevenness because of the leakage blocking layer 37 as compared with the display device 100 according to the first embodiment. Thus, film thicknesses of the light-emitting layers 34 can be made more uniform.

In addition, since the leakage blocking layer 37 is provided on an end portion of the light-emitting layer 34 having a small film thickness so as to be superimposed on the end portion, light can be prevented from being emitted at the end portion of the light-emitting layer 34.

Note that the display device 100 according to the first modified example of the first embodiment has the configuration in which the leakage blocking layer 37 that also functions as a bank is provided on the light-emitting layer 34. Thus, when the display device 100 according to the first modified example of the first embodiment is a display device of a top-emitting type, emission of excessive light from the light-emitting layer 34 due to excessive excitation by light emitted from another light-emitting layer 34 or external light can be more efficiently suppressed.

Method for Forming Light-Emitting Element Layer

Figure 7:
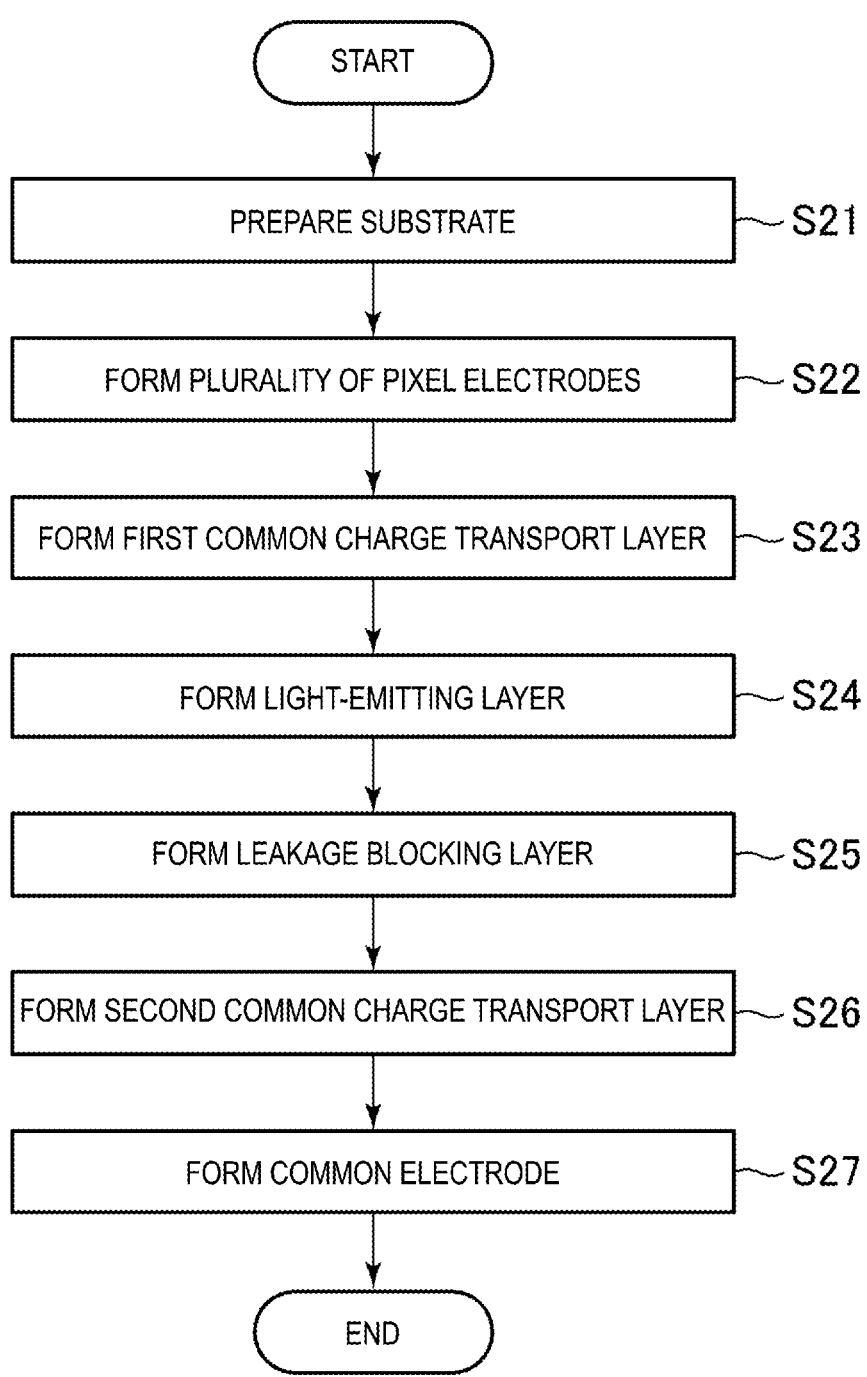
FIG. 7 is a flowchart illustrating a method for forming a light-emitting element layer included in the display device according to the first modified example of the first embodiment of the disclosure.
Figure 8A:
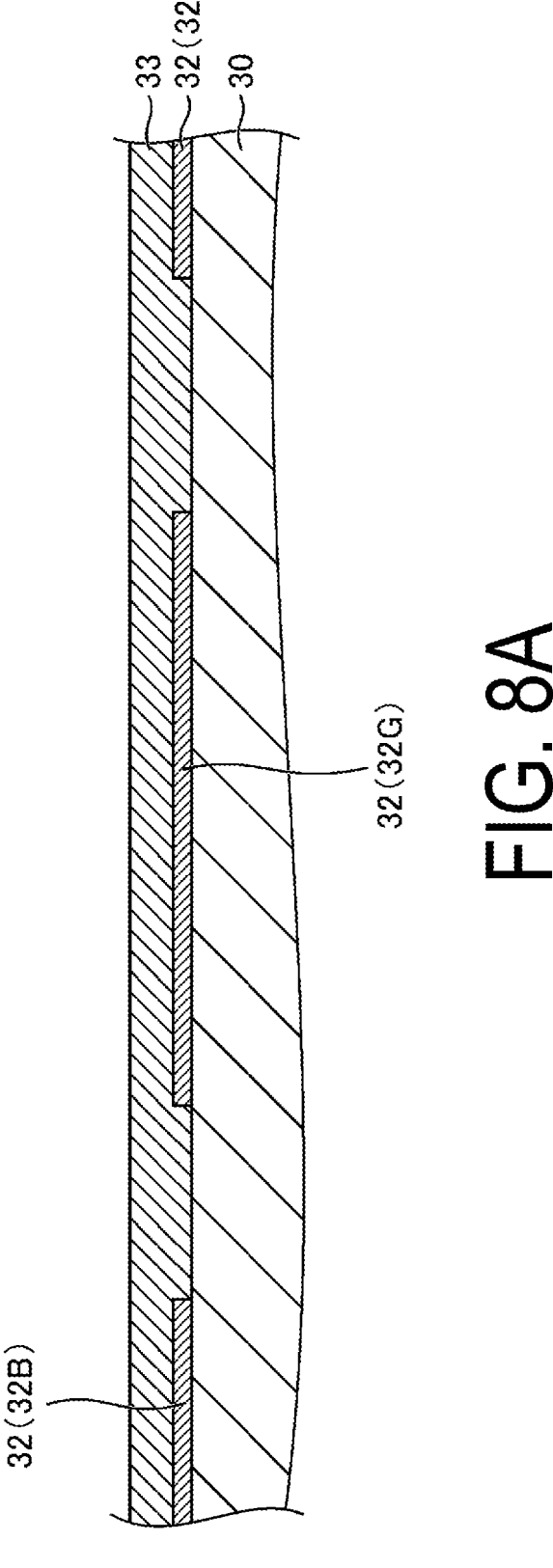
FIG. 8A is a cross-sectional view schematically illustrating an intermediate product of the display device according to the first modified example of the first embodiment of the disclosure.
Figure 8B:
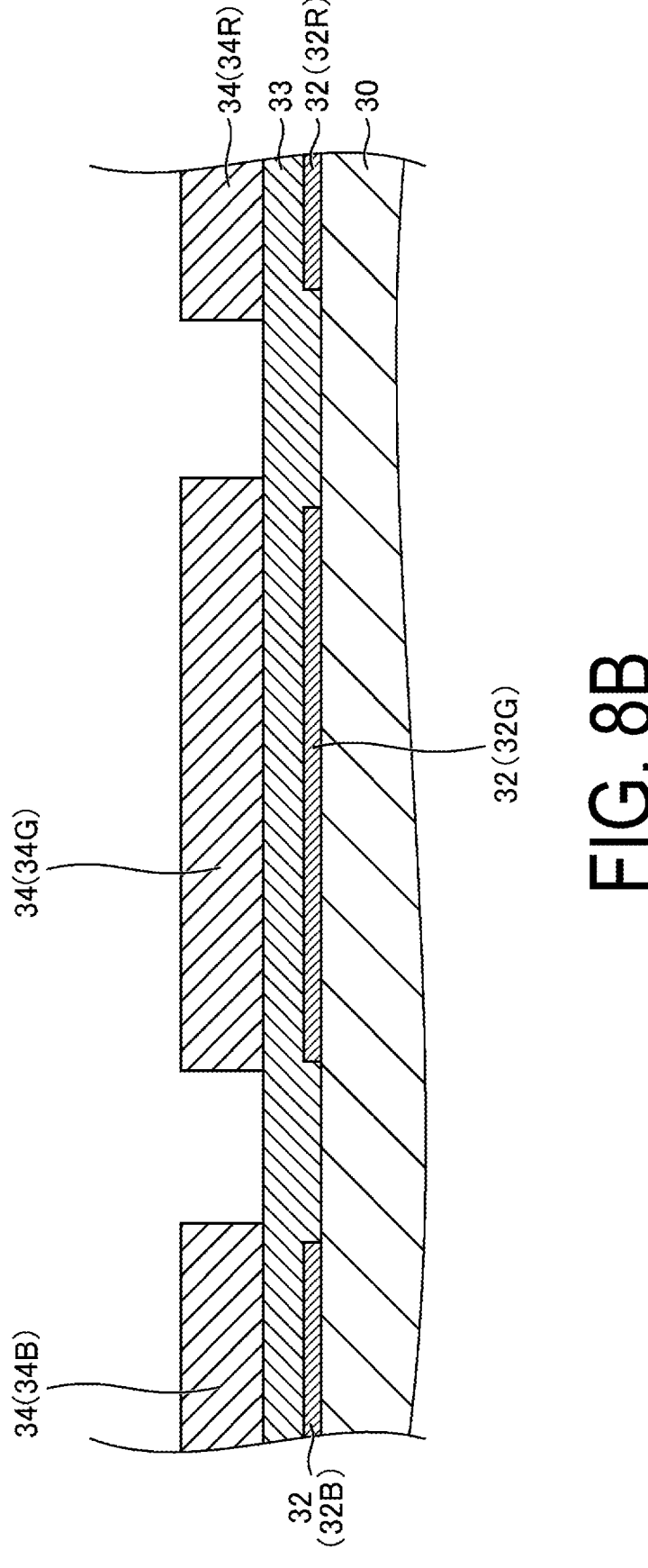
FIG. 8B is a cross-sectional view schematically illustrating an intermediate product of the display device according to the first modified example of the first embodiment of the disclosure.
Figure 8C:
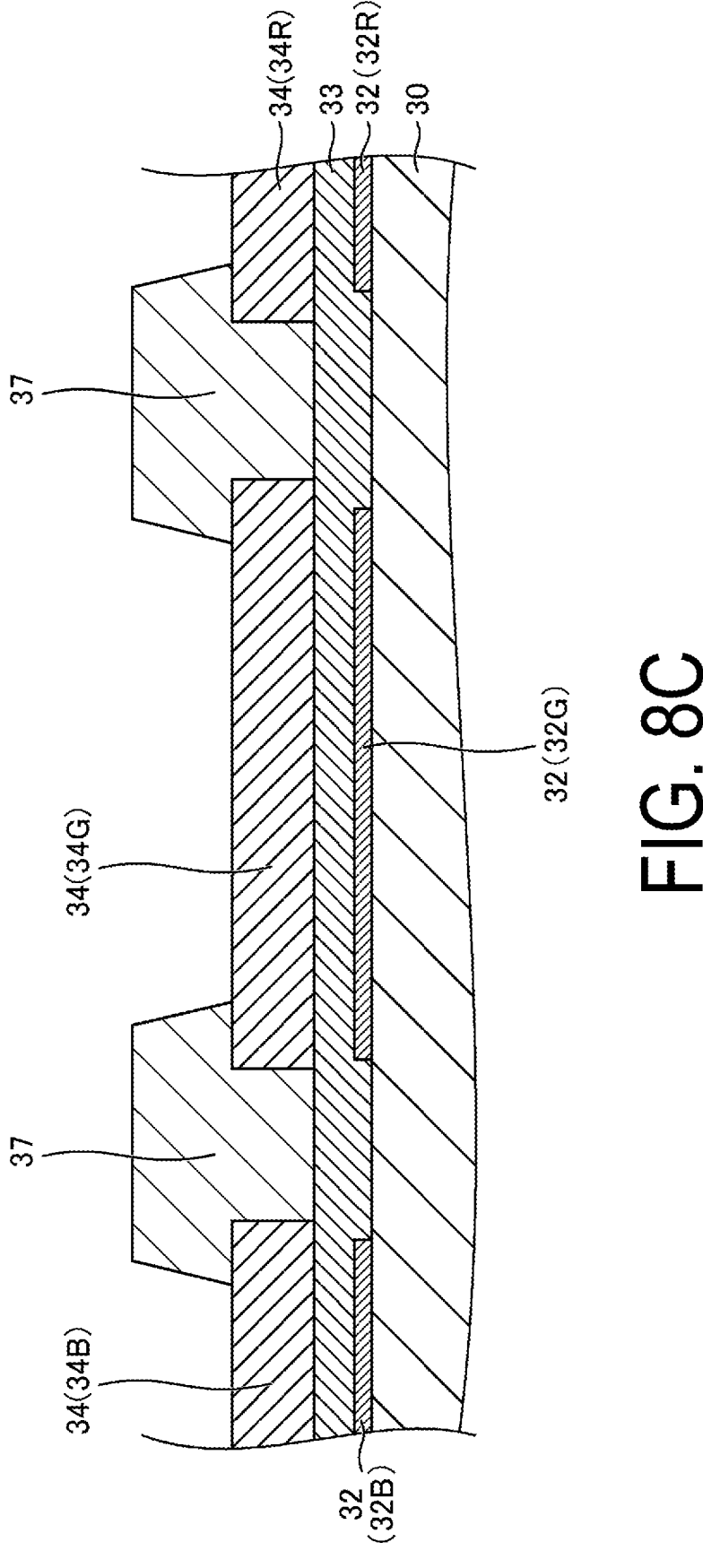
FIG. 8C is a cross-sectional view schematically illustrating an intermediate product of the display device according to the first modified example of the first embodiment of the disclosure.

FIG. 7 is a flowchart illustrating a method for forming the light-emitting element layer 31 included in the display device 100 according to the first modified example of the first embodiment of the disclosure. FIG. 8A to FIG. 8C are cross-sectional views schematically illustrating intermediate products of the display device 100 according to the first modified example of the first embodiment of the disclosure.

Since the process from step S21 to step S23 and the process of steps S26 and S27 illustrated in FIG. 7 are the same as the process from step S11 to step S13 and the process of steps S16 and S17 illustrated in FIG. 4, description thereof will be omitted.

That is, as illustrated in FIG. 8A, a plurality of pixel electrodes 32 (the first pixel electrode 32B, the second pixel electrode 32G, and the third pixel electrode 32R) are formed on the substrate 30 (step S22; pixel electrode forming), and the first common charge transport layer 33 is formed on the plurality of pixel electrodes 32 (step S23; first common charge transport layer forming).

Next, a plurality of light-emitting layers 34 (the first light-emitting layer 34B, the second light-emitting layer 34G, and the third light-emitting layer 34R) are formed on the first common charge transport layer 33 (step S24; light-emitting layer forming). That is, as illustrated in FIG. 8B, on the first common charge transport layer 33, the first light-emitting layer 32B, the second light-emitting layer 32G, and the third light-emitting layer 32R are formed at positions corresponding to the first pixel electrode 34B, the second pixel electrode 34G, and the third pixel electrode 34R, respectively.

Thereafter, as illustrated in FIG. 8C, the leakage blocking layer 37 having an insulating property is formed at a position where the leakage blocking layer 37 is superimposed over both of an end portion of the first pixel electrode 32B and an end portion of the second pixel electrode 32G that are adjacent to each other and at a position where the leakage blocking layer 37 is superimposed on both of the end portion 34B1 of the first light-emitting layer 34B and the end portion 34G1 of the second light-emitting layer 34G that are adjacent to each other in plan view. Further, the leakage blocking layer 37 is formed at a position where the leakage blocking layer 37 is superimposed over both of an end portion of the second pixel electrode 32G and an end portion of the third pixel electrode 32R that are adjacent to each other and at a position where the leakage blocking layer 37 is superimposed on both of the end portion 34G1 of the second light-emitting layer 34G and the end portion 34R1 of the third light-emitting layer 34R that are adjacent to each other in plan view (step S25; leakage blocking layer forming).

The leakage blocking layer 37 can be formed by, for example, photolithography or vapor deposition. In addition, a portion of the leakage blocking layer 37 superimposed on the end portion 34B1 of the first light-emitting layer 34B and the end portion 34G1 of the second light-emitting layer 34G and a portion of the leakage blocking layer 37 superimposed on the end portion 34G1 of the second light-emitting layer 34G and the end portion 34R1 of the third light-emitting layer 34R in plan view are integrally formed.

After the leakage blocking layer 37 is formed, the second common charge transport layer 35 is formed on the plurality of light-emitting layers 34 (the first light-emitting layer 34B, the second light-emitting layer 34G, and the third light-emitting layer 34R) and the leakage blocking layer 37 (step S26). Furthermore, the common electrode 36 is formed on the second common charge transport layer 35 and over the plurality of light-emitting layers 34 (the first light-emitting layer 34B, the second light-emitting layer 34G, and the third light-emitting layer 34R) (step S27; common electrode forming).

In this manner, the light-emitting element layer 31 included in the display device 100 according to the first modified example of the first embodiment can be formed on the substrate 30.

Second Modified Example of First Embodiment

Figure 9:
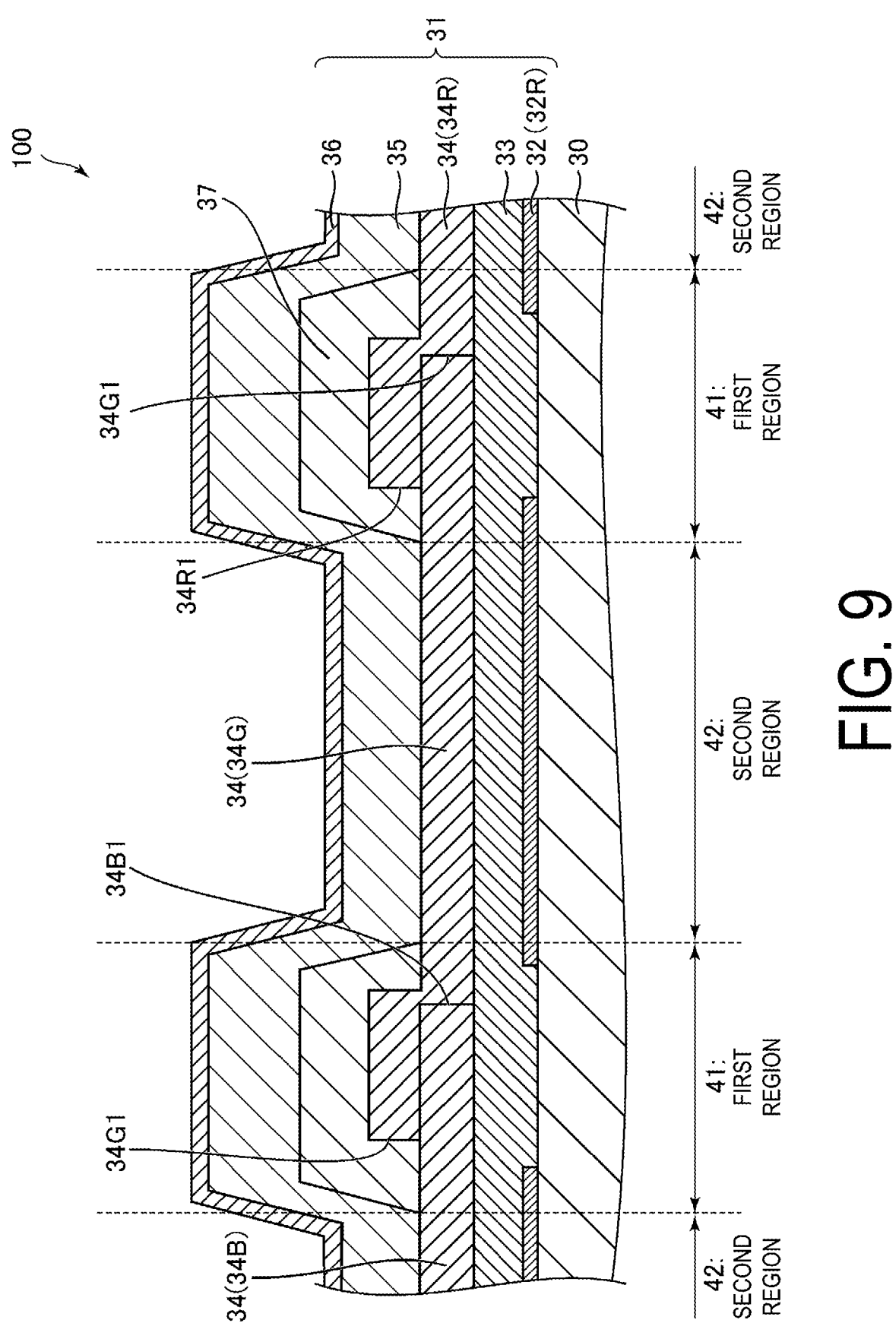
FIG. 9 is a cross-sectional view schematically illustrating a configuration of a display region of a display device according to a second modified example of the first embodiment of the disclosure.

Next, a configuration of a display device 100 according to a second modified example of the first embodiment will be described with reference to FIG. 9. FIG. 9 is a cross-sectional view schematically illustrating a configuration in a display region of the display device 100 according to the second modified example of the first embodiment of the disclosure.

As illustrated in FIG. 9, the display device 100 according to the second modified example of the first embodiment has a configuration in which the arrangement of the light-emitting layers 34 are changed in the configuration of the display device 100 according to the first modified example of the first embodiment.

That is, in the display device 100 according to the first modified example of the first embodiment, the first light-emitting layer 34B and the second light-emitting layer 34G that are adjacent to each other are arranged with a predetermined interval therebetween. In addition, the second light-emitting layer 34G and the third light-emitting layer 34R that are adjacent to each other are arranged with a predetermined interval therebetween.

On the other hand, the display device 100 according to the second modified example of the first embodiment has a configuration in which a part of the second light-emitting layer 34G is layered on the end portion 34B1 of the first light-emitting layer 34B. Further, a part of the third light-emitting layer 34R is layered on the end portion 34G1 of the second light-emitting layer 34G. That is, a light-emitting region corresponding to the second region of each of the first light-emitting layer 34B, the second light-emitting layer 34G, and the third light-emitting layer 34R and at least a part of a non-light-emitting region corresponding to the first region are formed on the first common charge transport layer 33 so as to be on the same plane.

Then, the leakage blocking layer 37 is provided so as to be superimposed over a region in which the first light-emitting layer 34B and the second light-emitting layer 34G are layered and that includes the end portion 34B1 of the first light-emitting layer 34B and the end portion 34G1 of the second light-emitting layer 34G in plan view. Furthermore, the leakage blocking layer 37 is provided so as to be superimposed over a region in which the second light-emitting layer 34G and the third light-emitting layer 34R are layered and that includes the end portion 34G1 of the second light-emitting layer 34G and the end portion 34R1 of the third light-emitting layer 34R in plan view.

As described above, the display device 100 according to the second modified example of the first embodiment has a configuration similar to that of the display device 100 according to the first modified example of the first embodiment except that the arrangement of the light-emitting layers 34 is different.

Thus, the light-emitting element layer 31 included in the display device 100 according to the second modified example of the first embodiment can be formed by a process similar to that of the light-emitting element layer 31 included in the display device 100 according to the first modified example of the first embodiment except for the light-emitting layer forming. That is, for the display device 100 according to the second modified example of the first embodiment, the second light-emitting layer 34G is layered on an end portion of the first light-emitting layer 34B arranged on the second light-emitting layer 34G side in the light-emitting layer forming of step S24 described above. Further, the third light-emitting layer 34R is layered on an end portion of the second light-emitting layer 34G arranged on the third light-emitting layer 34R side.

As described above, the display device 100 according to the second modified example of the first embodiment has a configuration in which the second light-emitting layer 34G is layered on the end portion 34B1 of the first light-emitting layer 34B. Further, the third light-emitting layer 34R is layered on the end portion 34G1 of the second light-emitting layer 34G. For this reason, compared to the configuration in which the first light-emitting layer 34B, the second light-emitting layer 34G, and the third light-emitting layer 34R are arranged at predetermined intervals, a range of an end portion of the light-emitting layer 34 exposed to the outside can be reduced when the leakage blocking layer 37 is formed. This can suppress peel-off of the light-emitting layer 34 when the leakage blocking layer 37 is formed. Thus, the display device 100 according to the second modified example of the first embodiment can suppress color mixing or the like caused by the peel-off of the light-emitting layer 34.

Third Modified Example of First Embodiment

Figure 10:
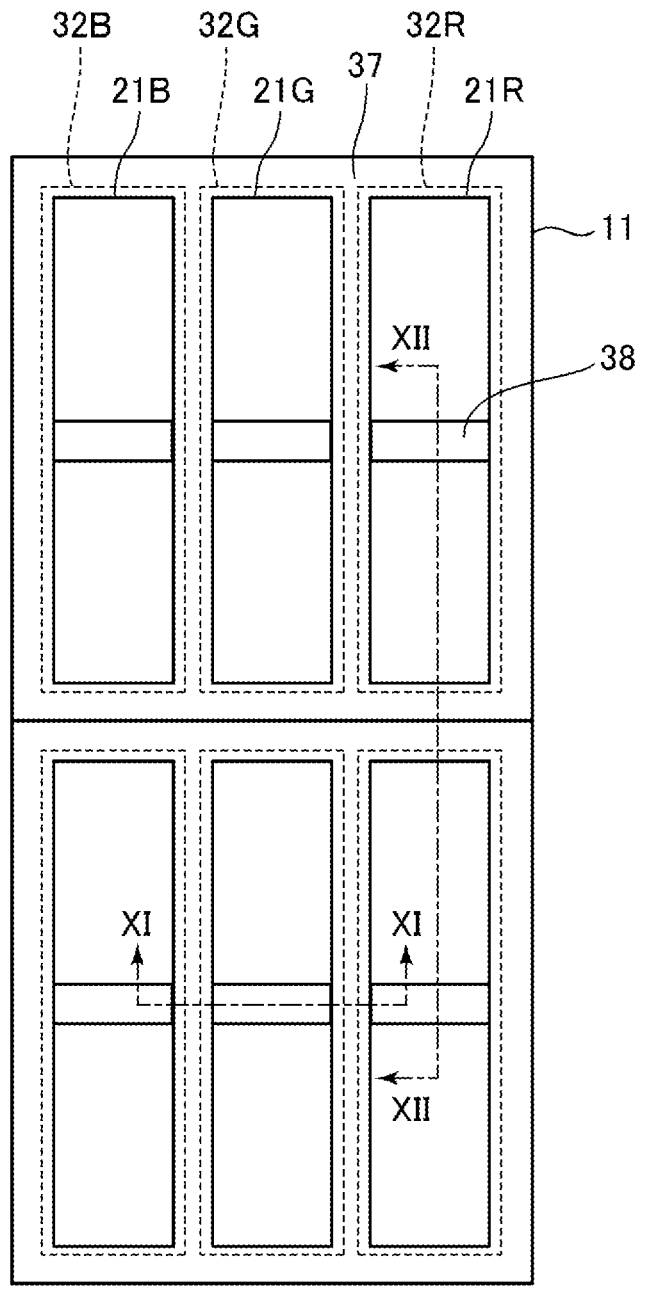
FIG. 10 is a plan view schematically illustrating a pixel included in a display device according to a third modified example of the first embodiment of the disclosure.
Figure 11:
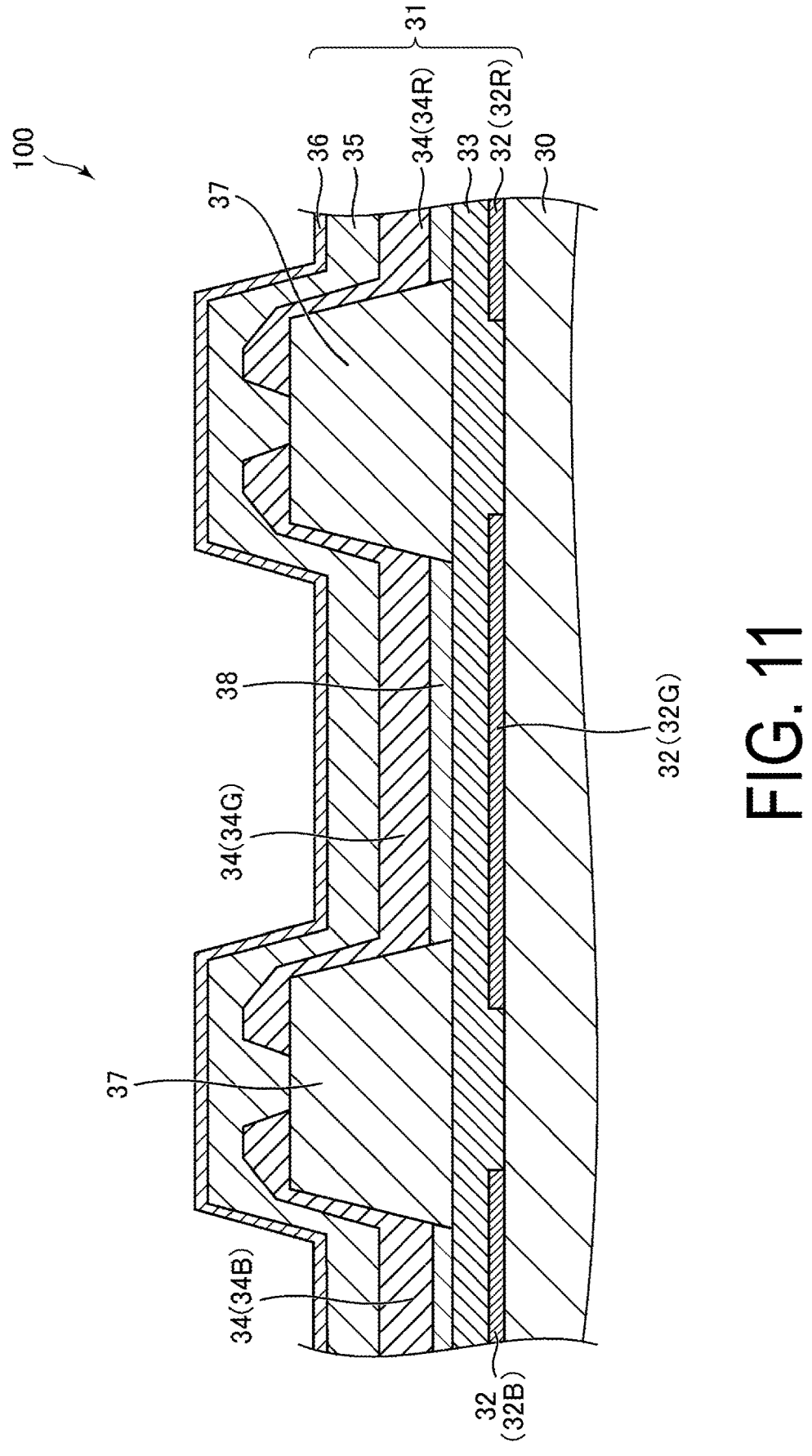
FIG. 11 is a cross-sectional view schematically illustrating a configuration in a display region of the display device according to the third modified example of the first embodiment of the disclosure.
Figure 12:
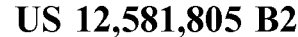
FIG. 12 is a cross-sectional view schematically illustrating a configuration in the display region of the display device according to the third modified example of the first embodiment of the disclosure.

Next, a display device 100 according to a third modified example of the first embodiment will be described with reference to FIG. 10, FIG. 11, and FIG. 12. FIG. 10 is a plan view schematically illustrating a pixel 11 included in the display device 100 according to the third modified example of the first embodiment of the disclosure. FIG. 11 and FIG. 12 are cross-sectional views schematically illustrating a configuration in a display region of the display device 100 according to the third modified example of the first embodiment of the disclosure. FIG. 11 is a cross-sectional view taken along a line XI-XI in the pixel 11 illustrated in FIG. 10. FIG. 12 is a cross-sectional view taken along a line XII-XII in the pixel 11 illustrated in FIG. 10.

As illustrated in FIG. 10, FIG. 11, and FIG. 12, the display device 100 according to the third modified example of the first embodiment is different from the display device 100 according to the first embodiment in that an insulating layer 38 is further provided. Otherwise, as illustrated in FIG. 11, a configuration of the light-emitting element layer 31 included in the display device 100 according to the third modified example of the first embodiment is similar to the configuration of the light-emitting element layer 31 included in the display device 100 according to the first embodiment.

That is, the insulating layer 38 is disposed at positions where the first pixel electrode 32B, the second pixel electrode 32G, and the third pixel electrode 32R are divided into a plurality of regions in plan view, and is arranged between each of the first pixel electrode 32B, the second pixel electrode 32G, and the third pixel electrode 32R and the common electrode 36 in cross-sectional view. More specifically, as illustrated in FIG. 10 to FIG. 12, the insulating layer 38 is provided between the first common charge transport layer 33 and the light-emitting layer 34 so as to divide a region surrounded by the leakage blocking layer 37 into a plurality of regions. As illustrated in FIG. 12, the pixel electrode 32 is provided so as to be continuous at the lower layer of the insulating layer 38. On the other hand, the leakage blocking layer 37 is provided so as to partition each of the plurality of subpixels 21, and the pixel electrodes 32 are not continuous, and are divided at the lower layer of the leakage blocking layer 37.

Note that the display device 100 according to the third modified example of the first embodiment has a configuration in which each of the first pixel electrode 32B, the second pixel electrode 32G, and the third pixel electrode 32R is divided into two regions in plan view by the insulating layer 38. However, the number of divisions is not limited to two.

As described above, in the display device 100 according to the third modified example of the first embodiment, each of the first pixel electrode 32B, the second pixel electrode 32G, and the third pixel electrode 32R is divided into a plurality of regions in plan view, which can suppress enlargement of a dark spot generated in the light-emitting region of the light-emitting layer 34.

That is, it is known that when an excessive current flows between the pixel electrode 32 and the common electrode 36 that are included in the light-emitting element layer 31, a non-light-emitting portion called a dark spot is generated. When an excessive current continues to flow through the light-emitting element layer 31 in a state in which the dark spot is generated, a range of the dark spot expands.

In the display device 100 according to the third modified example of the first embodiment, the non-light-emitting region in which no current flows between the pixel electrode 32 and the common electrode 36 can be formed in the light-emitting layer 34 by the insulating layer 38. Thus, even when a dark spot is generated in one of the plurality of light-emitting regions of the light-emitting layer 34 divided by the insulating layer 38 in plan view, the non-light-emitting region formed by the insulating layer 38 can prevent an excessive current from flowing to another light-emitting region.

As a result, the display device 100 according to the third modified example of the first embodiment can stably emit light for a long period of time without enlarging the non-light-emitting region due to the dark spot.

Note that the insulating layer 38 may be provided separately from the leakage blocking layer 37 by using a different member. Alternatively, the insulating layer 38 may be formed integrally with the leakage blocking layer 37 by using the same member. When the insulating layer 38 is formed integrally with the leakage blocking layer 37, the insulating layer 38 can be formed together with the leakage blocking layer 37, and thus, the insulating layer 38 can be efficiently formed.

Figure 13:
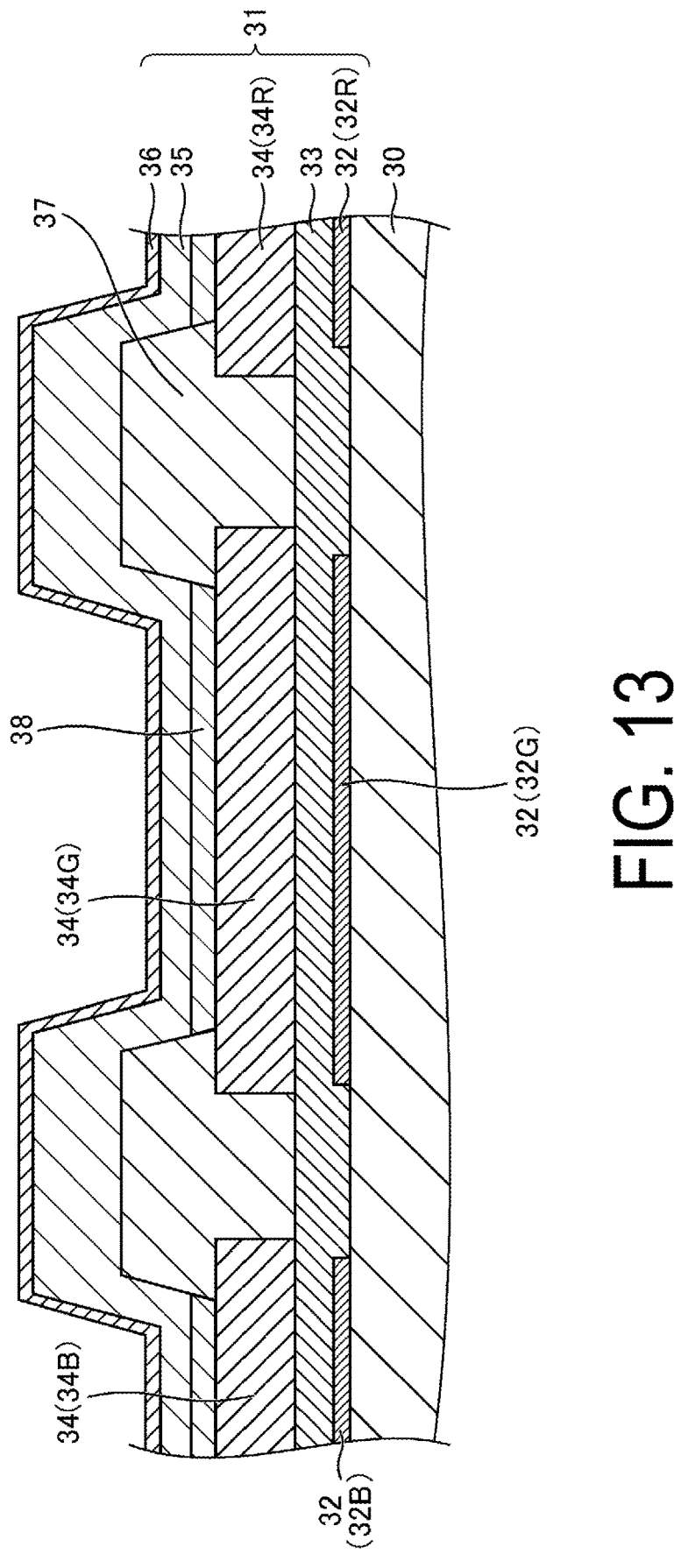
FIG. 13 is a cross-sectional view schematically illustrating a configuration in the display region of the display device according to the third modified example of the first embodiment of the disclosure.
Figure 14:
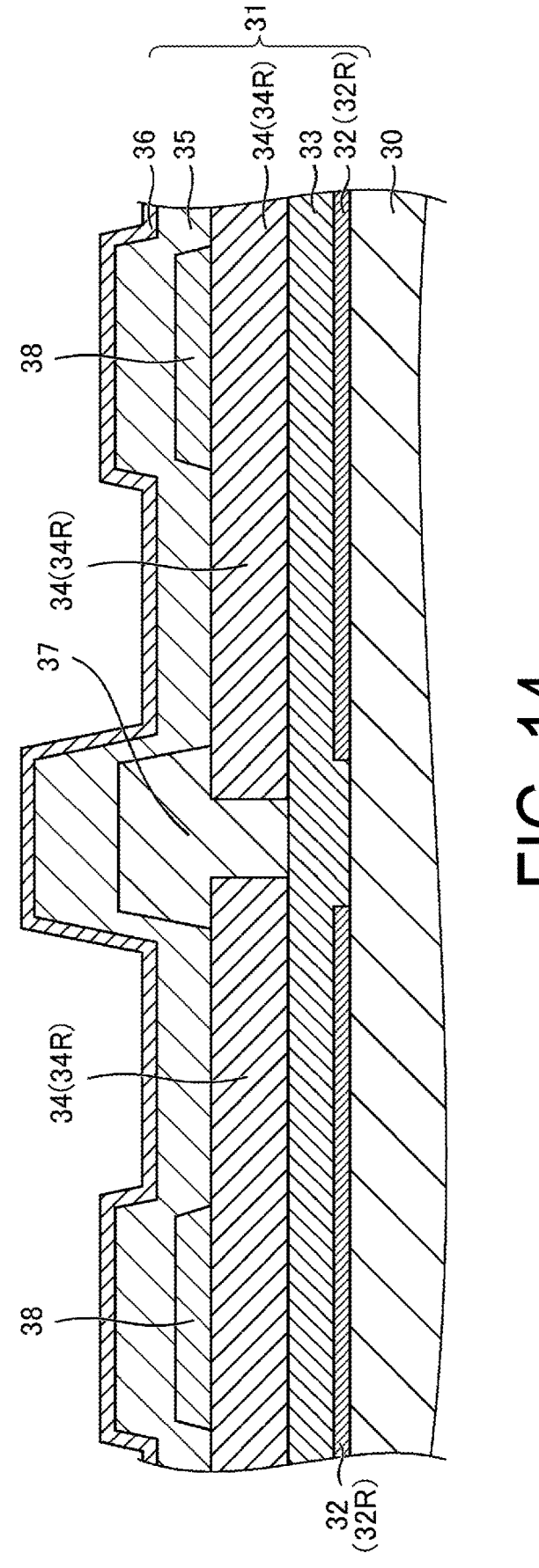
FIG. 14 is a cross-sectional view schematically illustrating a configuration in the display region of the display device according to the third modified example of the first embodiment of the disclosure.

Additionally, as illustrated in FIG. 13 and FIG. 14, the light-emitting element layer 31 included in the display device 100 according to the third modified example of the first embodiment may have a configuration in which the leakage blocking layer 37 is provided on the light-emitting layer 34, similarly to the configuration of the light-emitting element layer 31 included in the display device 100 according to the first modified example of the first embodiment. FIG. 13 and FIG. 14 are cross-sectional views schematically illustrating a configuration in a display region of the display device 100 according to the third modified example of the first embodiment of the disclosure. FIG. 13 is a cross-sectional view of the pixel 11 illustrated in FIG. 10 taken along a line XI-XI. FIG. 14 is a cross-sectional view of the pixel 11 illustrated in FIG. 10 taken along a line XII-XII.

In this manner, when the light-emitting element layer 31 has a configuration in which the leakage blocking layer 37 is provided on the light-emitting layer 34, as illustrated in FIG. 10, FIG. 13, and FIG. 14, the insulating layer 38 is provided between the light-emitting layer 34 and the second common charge transport layer 35 so as to divide a region surrounded by the leakage blocking layer 37 into a plurality of regions.

Fourth Modified Example of First Embodiment

Figure 15:
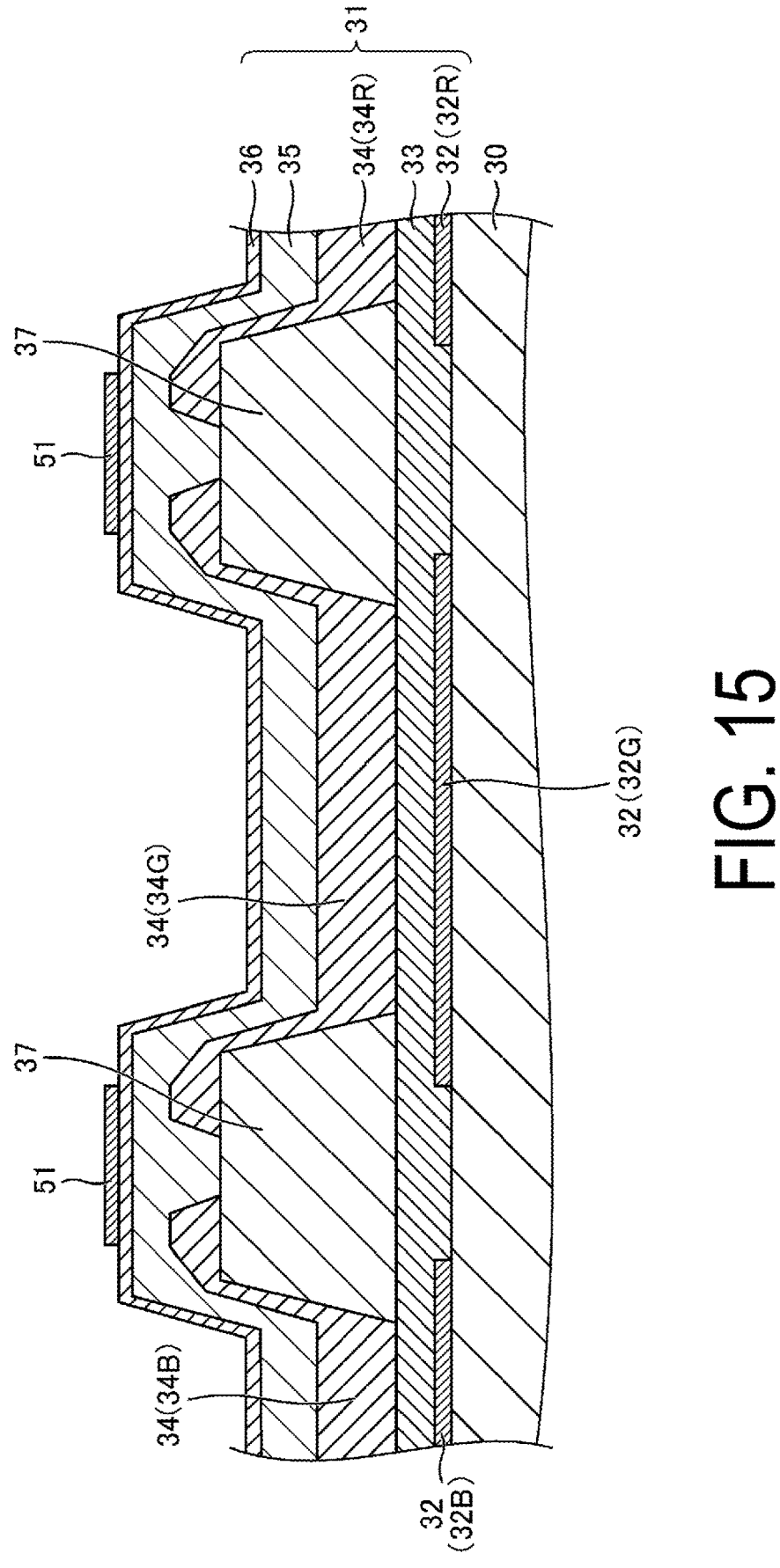
FIG. 15 is a cross-sectional view schematically illustrating a configuration in a display region of a display device according to a fourth modified example of the first embodiment of the disclosure.

A display device 100 according to a fourth modified example of the first embodiment will be described with reference to FIG. 15. FIG. 15 is a cross-sectional view schematically illustrating a configuration in a display region of the display device 100 according to the fourth modified example of the first embodiment of the disclosure. As illustrated in FIG. 15, the display device 100 according to the fourth modified example of the first embodiment is different from the display device 100 according to the first embodiment in that an auxiliary wiring line 51 is further provided. Since the configuration of the light-emitting element layer 31 included in the display device 100 according to the fourth modified example of the first embodiment is similar to the configuration of the light-emitting element layer 31 included in the display device 100 according to the first embodiment, description thereof will be omitted. Note that the configuration of the light-emitting element layer 31 is not limited thereto, and may be similar to the configuration of the light-emitting element layer 31 included in the display device 100 according to the first modified example of the first embodiment.

Incidentally, when the common electrode 36 is, for example, a transparent electrode made of ITO or the like, electrical conductivity of the transparent electrode is not sufficient, and thus a potential drop may occur and uniformity of luminance may decrease.

Due to this, in the display device 100 according to the fourth modified example of the first embodiment, the auxiliary wiring line 51 made of a metal material having higher conductivity than that of the common electrode 36 is electrically connected to the common electrode 36. Then, the auxiliary wiring line 51 is arranged on the common electrode 36 at a position where the auxiliary wiring line 51 is superimposed over the leakage blocking layer 37 in plan view, that is, in the non-light-emitting region of the light-emitting element layer 31.

As described above, in the display device 100 according to the fourth modified example of the first embodiment, the auxiliary wiring line 51 can be provided, which can reduce a potential drop of the common electrode 36. In addition, the auxiliary wiring line 51 is arranged in the non-light-emitting region, which can prevent light emitted from the light-emitting element layer 31 from being blocked by the auxiliary wiring line 51.

Fifth Modified Example of First Embodiment

Figure 16:
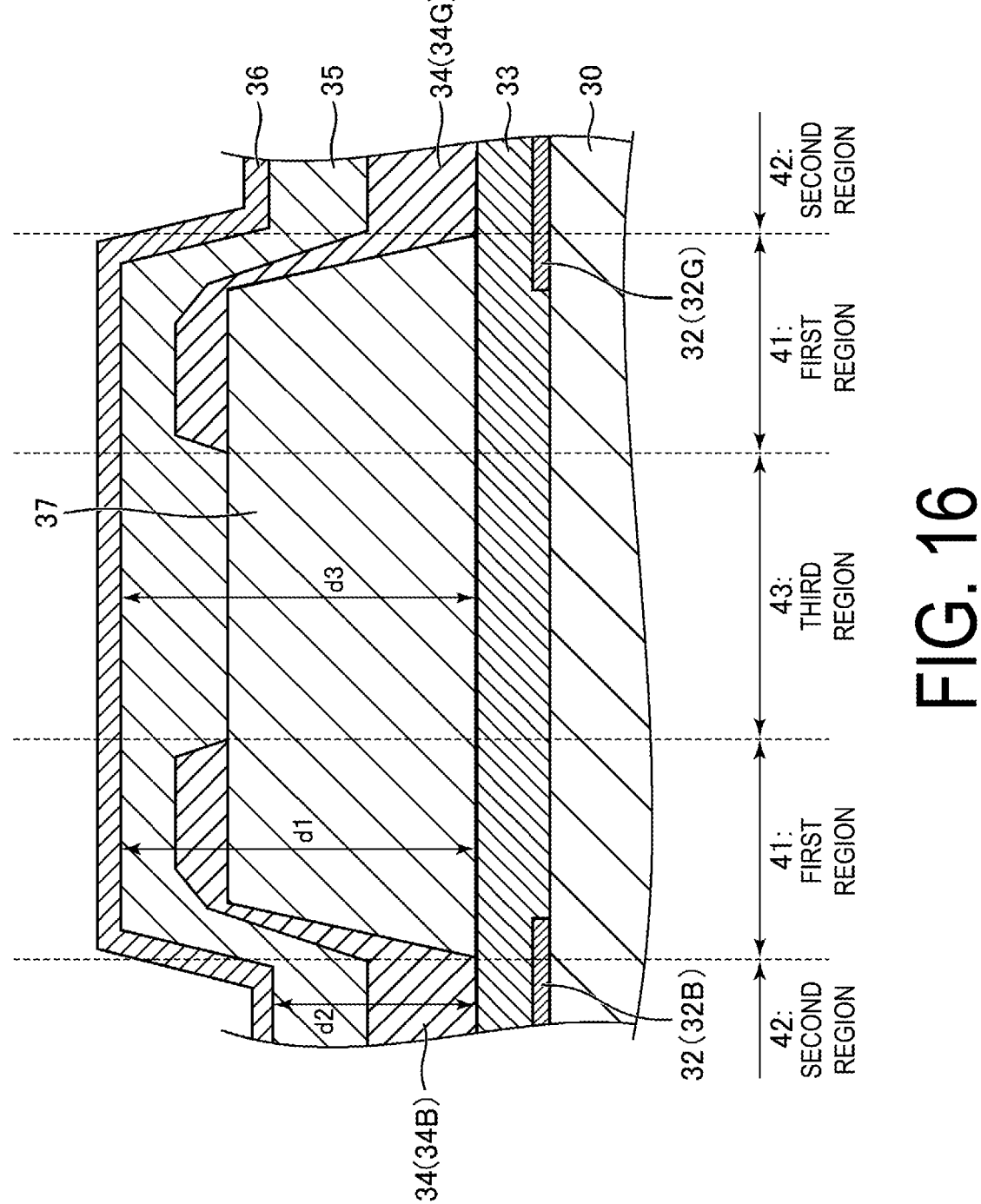
FIG. 16 is a cross-sectional view schematically illustrating a configuration in a display region of a display device according a fifth modified example of the first embodiment of the disclosure.

A configuration of a display device 100 according to a fifth modified example of the first embodiment will be described below with reference to FIG. 16. FIG. 16 is a cross-sectional view schematically illustrating a configuration in a display region of the display device 100 according the fifth modified example of the first embodiment of the disclosure. FIG. 16 illustrates an example of a configuration of the light-emitting element layer 31 included in the display device 100 according to the fifth modified example of the first embodiment. Similarly to the light-emitting element layer 31 of the display device 100 according to the first embodiment, the display device 100 according to the fifth modified example of the first embodiment has a configuration in which the light-emitting layer 34 is arranged on the leakage blocking layer 37 functioning as a bank. However, the configuration of the light-emitting element layer 31 included in the display device 100 according to the fifth modified example of the first embodiment is not limited thereto. For example, the light-emitting element layer 31 included in the display device 100 according to the fifth modified example of the first embodiment may have a configuration in which the leakage blocking layer 37 functioning as a bank is disposed on the light-emitting layer 34, similarly to the light-emitting element layer 31 included in the display device 100 according to the first modified example of the first embodiment.

As illustrated in FIG. 16, in the display device 100 according to the fifth modified example of the first embodiment, the leakage blocking layer 37 is also provided in a third region 43 where the leakage blocking layer 37 and neither of the first light-emitting layer 34B nor the second light-emitting layer 34G is superimposed in plan view.

With this configuration, a distance d3 between the first common charge transport layer 33 and the common electrode 36 in the third region 43 can be made larger than a distance d2 between the first common charge transport layer 33 and the common electrode 36 in the second region 42. Thus, flowing of a leakage current can be suppressed also in the third region 43.

Second Embodiment

Figure 17:
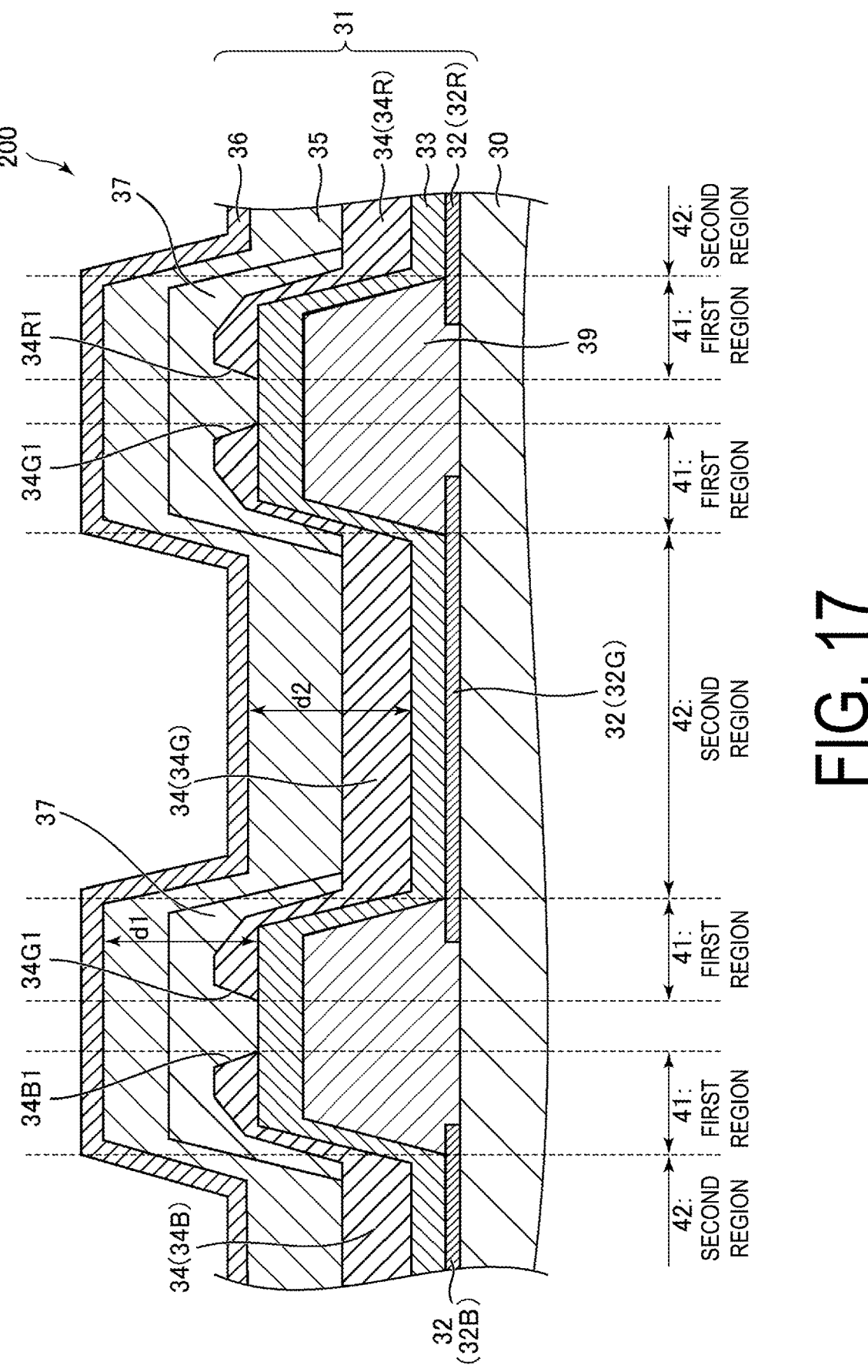
FIG. 17 is a cross-sectional view schematically illustrating a configuration in a display region of a display device according to a second embodiment of the disclosure.

Next, a configuration of a display device 200 according to a second embodiment will be described with reference to FIG. 17. FIG. 17 is a cross-sectional view schematically illustrating a configuration in a display region of the display device 200 according to the second embodiment of the disclosure.

The display device 200 according to the second embodiment is different from the display device 100 according to the first embodiment in that an edge cover 39 is further provided and the leakage blocking layer 37 is arranged so as to cover the edge cover 39. With respect to other points, the display device 100 according to the first embodiment and the display device 200 according to the second embodiment are the same or similar, and thus, the same reference signs are assigned to the same or similar members, and detailed description thereof will be omitted.

As illustrated in FIG. 17, the display device 200 according to the second embodiment includes the light-emitting element layer 31, the leakage blocking layer 37, and the edge cover 39 on the substrate 30. The light-emitting element layer 31 has a configuration in which the pixel electrode 32, the first common charge transport layer 33, the light-emitting layer 34, the second common charge transport layer 35, and the common electrode 36 are layered in this order from the substrate 39 side.

The edge cover 39 is made of an insulating material and prevents the pixel electrode 32 and the common electrode 36 from being short-circuited due to electrical field concentration at an end portion of the pixel electrode 32. Photosensitive resin may be used as a material of the edge cover 39. As the photosensitive resin, for example, acrylic resin or polyimide resin can be used.

As illustrated in FIG. 17, the edge cover 39 is provided between the first light-emitting layer 34B and the second light-emitting layer 34G. Further, the edge cover 39 covers end portions of the first pixel electrode 32B and the second pixel electrode 32G. In addition, the edge cover 39 is provided between the second light-emitting layer 34G and the third light-emitting layer 34R. Further, the edge cover 39 covers end portions of the second pixel electrode 32G and the third pixel electrode 32R. Additionally, the first common charge transport layer 33 is solidly formed on the first pixel electrode 32B, the second pixel electrode 32G, and the third pixel electrode 32R, and the edge cover 39.

The first light-emitting layer 32B, the second light-emitting layer 32G, and the third light-emitting layer 32R are provided on the first common charge transport layer 33 at positions facing the first pixel electrode 34B, the second pixel electrode 34G, and the third pixel electrode 34R, respectively. Additionally, a non-light-emitting region including an end portion of each light-emitting layer 34 is arranged over the edge cover 39 with the first common charge transport layer 33 interposed therebetween.

In addition, the leakage blocking layer 37 is provided on the first common charge transport layer 33 at a position where the leakage blocking layer 37 is superimposed on the edge cover 39 and an end portion of each light-emitting layer 34 in plan view.

The leakage blocking layer 37 defines an end portion of a light-emitting region in the light-emitting element layer 31 and functions as a so-called bank. In addition, the leakage blocking layer 37 is integrally formed so as to partition the pixels 11 from each other across the plurality of pixels 11 arranged in a matrix and to partition each of the plurality of subpixels 21 constituting each pixel 11.

The second common charge transport layer 35 is provided on the plurality of light-emitting layers 34 and the leakage blocking layer 37, and the common electrode 36 is provided on the second common charge transport layer 35. In addition, by arranging the leakage blocking layer 37 so as to be superimposed over the edge cover 39, in the display device 200 according to the second embodiment, a distance between the first common charge transport layer 33 and the common electrode 36 is larger in the first region 41 than in the second region 42 (d1>d2).

Thus, an electrical resistance between the first common charge transport layer 33 and the common electrode 36 in the first region 41 can be made equal to or higher than an electrical resistance between the first common charge transport layer 33 and the common electrode 36 in the second region 42. As a result, the display device 200 according to the second embodiment can suppress a leakage current generated at an end portion of the light-emitting layer 34.

Note that in the display device 200 according to the second embodiment, the edge cover 39 may be a structure that functions not only as an edge cover but also as a bank. Even when the edge cover 39 is a structure that also functions as the bank in this way, the first common charge transport layer 33 can be provided between the structure and the leakage blocking layer 37. That is, in the display device 200 according to the second embodiment, the leakage blocking layer 37 is formed over the structure with the first common charge transport layer 33 interposed therebetween. The second common charge transport layer 35 is further formed over the leakage blocking layer 37 and the plurality of light-emitting layers 34, and the common electrode 36 is formed on the second common charge transport layer 35. In addition, a distance between the first common charge transport layer 33 and the common electrode 36 is made larger in the first region 41 than in the second region 42.

First Modified Example of Second Embodiment

Figure 18:
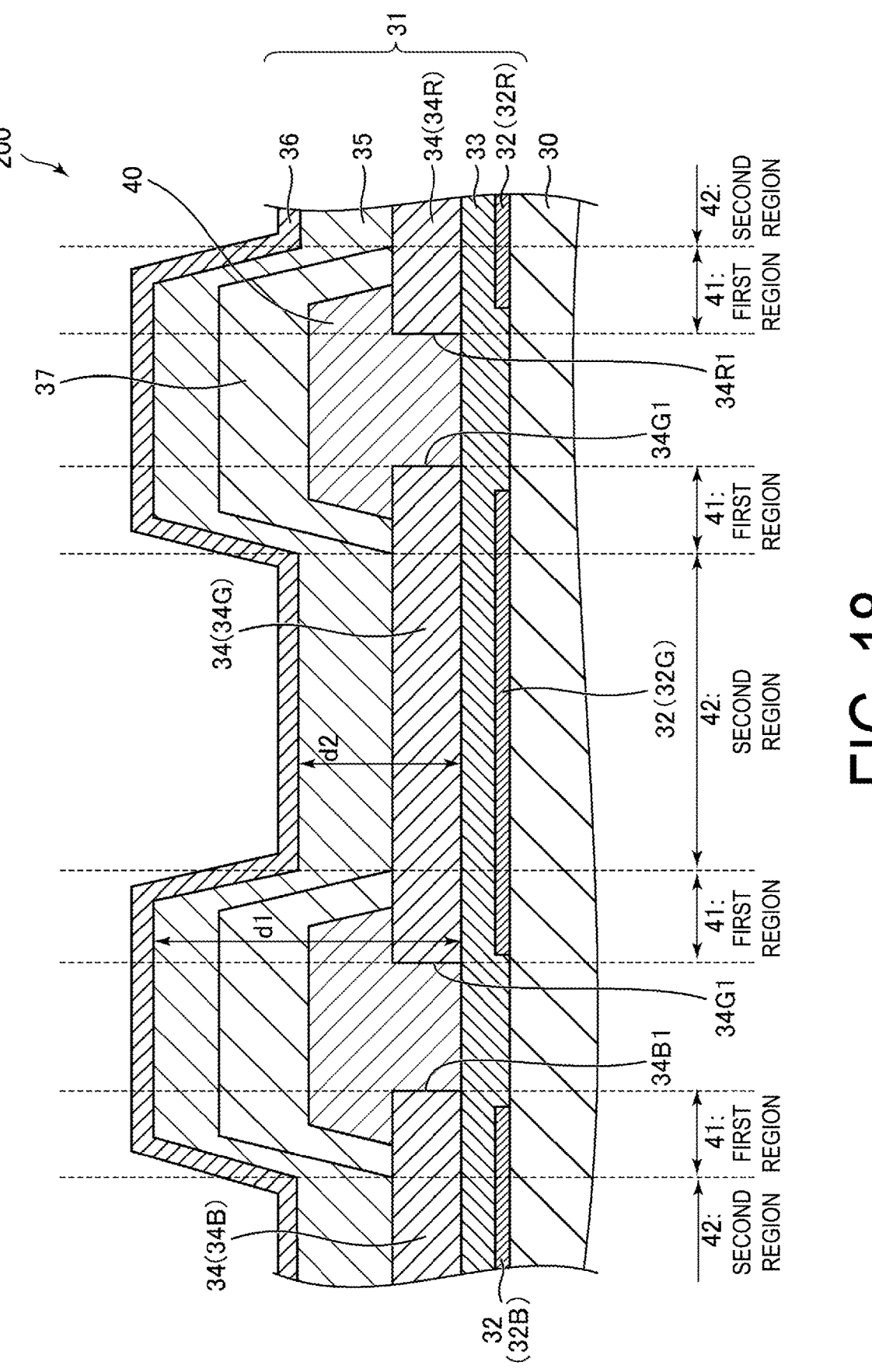
FIG. 18 is a cross-sectional view schematically illustrating a configuration in a display region of a display device according to a first modified example of the second embodiment of the disclosure.

Next, a configuration of a display device 200 according to a first modified example of the second embodiment will be described with reference to FIG. 18. FIG. 18 is a cross-sectional view schematically illustrating a configuration in a display region of the display device 200 according to the first modified example of the second embodiment of the disclosure.

The display device 200 according to the second embodiment has a configuration in which the leakage blocking layer 37 is arranged at a position where the leakage blocking layer 37 is superimposed on the edge cover 39. On the other hand, the display device 200 according to the first modified example of the second embodiment is different in that the leakage blocking layer 37 is arranged at a position where the leakage blocking layer 37 is superimposed on a bank 40. In addition, the display device 200 according to the second embodiment has a configuration in which the light-emitting layer 34 and the leakage blocking layer 37 are formed over the edge cover 39 with the first common charge transport layer 33 interposed therebetween. In contrast, in the display device 200 according to the first modified example of the second embodiment, the light-emitting layer 34 is provided on the first common charge transport layer 33. In addition, the display device 200 according to the first modified example of the second embodiment is also different in that the bank 40 is provided on the light-emitting layer 34 and the leakage blocking layer 37 is provided on the bank 40.

That is, in the display device 200 according to the first modified example of the second embodiment, the bank 40 is provided at a position where the bank 40 is superimposed on both of the end portions of the light-emitting layers 34 adjacent to each other in plan view. To be more specific, as illustrated in FIG. 18, the bank 40 is provided at a position where the bank 40 is superimposed on the end portion 34B1 of the first light-emitting layer 34B and the end portion 34G1 of the second light-emitting layer 34G that are adjacent to each other in plan view. Further, the bank 40 is also provided at a position where the bank 40 is superimposed on the end portion 34G1 of the second light-emitting layer 34G and the end portion 34R1 of the third light-emitting layer 34R that are adjacent to each other in plan view. Then, the leakage blocking layer 37 is arranged so as to be superimposed on the bank 40.

Thus, the leakage blocking layer 37 is arranged on the bank 40. Thus, even when the bank 40 has a small thickness from the first common charge transport layer 33 to the common electrode 36, the bank 40 can make the distance d1 between the first common charge transport layer 33 and the common electrode 36 in the first region 41 larger than the distance d2 between the first common charge transport layer 33 and the common electrode 36 in the second region 42.

Thus, an electrical resistance between the first common charge transport layer 33 and the common electrode 36 in the first region 41 can be made equal to or higher than an electrical resistance between the first common charge transport layer 33 and the common electrode 36 in the second region 42. Thus, the display device 200 according to the first modified example of the second embodiment can suppress a leakage current generated at an end portion of the light-emitting layer 34.

The disclosure is not limited to the embodiments described above, and may be substituted with a configuration that is substantially the same as the configuration described in the embodiments described above, a configuration that achieves the same action and effect, or a configuration capable of achieving the same object.

The invention claimed is:

1. A display device comprising:
   a first common charge transport layer;
   a first light-emitting layer and a second light-emitting layer, each formed on the first common charge transport layer;
   a common electrode formed over both of the first light-emitting layer and the second light-emitting layer;
   a leakage blocking layer having an insulating property, the leakage blocking layer being superimposed on two adjacent end portions of the first light-emitting layer and the second light-emitting layer in a plan view;
   a first pixel electrode and a second pixel electrode that are provided at positions facing the first light-emitting layer and the second light-emitting layer, respectively, under the first common charge transport layer; and
   a bank provided between the first light-emitting layer and the second light-emitting layer, the bank defining an end portion of a light-emitting region configured to emit light from each of the first light-emitting layer and the second light-emitting layer, wherein a distance between the first common charge transport layer and the common electrode is larger in a first region, in which each of the first light-emitting layer and the second light-emitting layer is superimposed on the leakage blocking layer, than in a second region, in which each of the first light-emitting layer and the second light-emitting layer is not superimposed on the leakage blocking layer, and the leakage blocking layer is superimposed on the bank.

2. The display device according to claim 1, wherein the leakage blocking layer is provided in a third region where neither the first light-emitting layer nor the second light-emitting layer is superimposed on the leakage blocking layer in the plan view.

3. The display device according to claim 1, further comprising:

a second common charge transport layer formed on both of the first light-emitting layer and the second light-emitting layer between the common electrode and the first and second light-emitting layers, wherein the leakage blocking layer is provided between the first common charge transport layer and the second common charge transport layer.

4. The display device according to claim 1, wherein the first common charge transport layer is provided between the bank and the leakage blocking layer.

5. The display device according to claim 1, wherein end portions of both of the first light-emitting layer and the second light-emitting layer are provided on the leakage blocking layer in the first region.

6. The display device according to claim 1, wherein the light-emitting region that corresponds to the second region of each of the first light-emitting layer and the second light-emitting layer and at least a part of a non-light-emitting region corresponding to the first region of each of the first light-emitting layer and the second light-emitting layer are formed on an identical plane.

7. The display device according to claim 1, wherein the second light-emitting layer is layered on an end portion of the first light-emitting layer, and the leakage blocking layer is superimposed on a region in which the first light-emitting layer and the second light-emitting layer are layered in the plan view.

8. The display device according to claim 1, further comprising:

an insulating layer arranged between the common electrode and the first and second pixel electrodes, the insulating layer dividing each of the first pixel electrode and the second pixel electrode into a plurality of regions in the plan view.

9. The display device according to claim 1, further comprising:

an auxiliary wiring line arranged at a position where the auxiliary wiring line is superimposed on the leakage blocking layer in the plan view, the auxiliary wiring line being electrically connected to the common electrode.

10. The display device according to claim 1, wherein a portion of the leakage blocking layer superimposed on an end portion of the first light-emitting layer and a portion of the leakage blocking layer superimposed on an end portion of the second light-emitting layer are integrally formed.

11. A display device comprising:

a first common charge transport layer;

a first light-emitting layer and a second light-emitting layer, each formed on the first common charge transport layer;

a common electrode formed over both of the first light-emitting layer and the second light-emitting layer;

a leakage blocking layer having an insulating property, the leakage blocking layer being superimposed on two adjacent end portions of the first light-emitting layer and the second light-emitting layer in a plan view;

a first pixel electrode and a second pixel electrode that are provided at positions facing the first light-emitting layer and the second light-emitting layer, respectively, under the first common charge transport layer; and an edge cover provided between the first light-emitting layer and the second light-emitting layer, the edge cover covering end portions of both of the first pixel electrode and the second pixel electrode, wherein a distance between the first common charge transport layer and the common electrode is larger in a first region, in which each of the first light-emitting layer and the second light-emitting layer is superimposed on the leakage blocking layer, than in a second region, in which each of the first light-emitting layer and the second light-emitting layer is not superimposed on the leakage blocking layer, and wherein the leakage blocking layer is superimposed on the edge cover.

12. The display device according to claim 11, wherein the first common charge transport layer is provided between the edge cover and the leakage blocking layer.

13. The display device according to claim 11, wherein the leakage blocking layer is provided in a third region where neither the first light-emitting layer nor the second light-emitting layer is superimposed on the leakage blocking layer in the plan view.

14. The display device according to claim 11, further comprising:

a second common charge transport layer formed on both of the first light-emitting layer and the second light-emitting layer between the common electrode and the first and second light-emitting layers, wherein the leakage blocking layer is provided between the first common charge transport layer and the second common charge transport layer.

15. The display device according to claim 11, wherein end portions of both of the first light-emitting layer and the second light-emitting layer are provided on the leakage blocking layer in the first region.

16. The display device according to claim 11, wherein the light-emitting region that corresponds to the second region of each of the first light-emitting layer and the second light-emitting layer and at least a part of a non-light-emitting region corresponding to the first region of each of the first light-emitting layer and the second light-emitting layer are formed on an identical plane.

17. The display device according to claim 11, wherein the second light-emitting layer is layered on an end portion of the first light-emitting layer, and the leakage blocking layer is superimposed on a region in which the first light-emitting layer and the second light-emitting layer are layered in the plan view.

18. The display device according to claim 11, further comprising:

an insulating layer arranged between the common electrode and the first and second pixel electrodes, the insulating layer dividing each of the first pixel electrode and the second pixel electrode into a plurality of regions in the plan view.

19. The display device according to claim 11, further comprising:

an auxiliary wiring line arranged at a position where the auxiliary wiring line is superimposed on the leakage blocking layer in the plan view, the auxiliary wiring line being electrically connected to the common electrode.

20. The display device according to claim 11, wherein a portion of the leakage blocking layer superimposed on an end portion of the first light-emitting layer and a portion of the leakage blocking layer superimposed on an end portion of the second light-emitting layer are integrally formed.

* * * * *